United States Patent
Salvador et al.

(10) Patent No.: US 12,413,208 B2
(45) Date of Patent: Sep. 9, 2025

(54) METHOD AND APPARATUS FOR FILTERING AND AMPLIFYING HIGHER POWER COMMUNICATION SIGNALS

(71) Applicant: AT&T Intellectual Property I, L.P., Atlanta, GA (US)

(72) Inventors: Andy P. Salvador, Bellevue, WA (US); Mikko Juuso, Oulu (FI); Jani Lyrintzis, Snohomish, WA (US); Toni Lehtimaki, Oulu (FI)

(73) Assignee: AT&T Intellectual Property I, L.P., Atlanta, GA (US)

( * ) Notice: Subject to any disclaimer, the term of this patent is extended or adjusted under 35 U.S.C. 154(b) by 374 days.

(21) Appl. No.: 17/945,785

(22) Filed: Sep. 15, 2022

(65) Prior Publication Data

US 2024/0097652 A1    Mar. 21, 2024

(51) Int. Cl.
*H03H 9/64* (2006.01)
*H03H 9/25* (2006.01)
*H03H 9/72* (2006.01)

(52) U.S. Cl.
CPC ............ *H03H 9/6433* (2013.01); *H03H 9/25* (2013.01); *H03H 9/725* (2013.01)

(58) Field of Classification Search
CPC ............... C12Q 1/6827; C12Q 1/6886; C12Q 2600/156; G16B 20/10; G16B 20/20; G16B 30/00; G16B 30/10; G16H 10/40; G16H 20/10; G16H 50/20; Y02A 90/10; H03H 9/25; H03H 9/6433; H03H 9/6489; H03H 9/725; H04B 1/40
See application file for complete search history.

(56) References Cited

U.S. PATENT DOCUMENTS

| | | | |
|---|---|---|---|
| 2006/0290546 A1* | 12/2006 | Phillips | H04B 1/0003 341/119 |
| 2008/0174501 A1* | 7/2008 | Licul | H01Q 11/08 343/893 |
| 2011/0069644 A1* | 3/2011 | Kim | H04B 1/0057 370/278 |
| 2015/0263405 A1* | 9/2015 | Khlat | H03H 9/706 333/118 |
| 2015/0341058 A1* | 11/2015 | Khlat | H04B 1/58 370/297 |
| 2017/0195018 A1* | 7/2017 | Ma | H01Q 25/00 |
| 2022/0291395 A1* | 9/2022 | Iyengar | H01Q 9/42 |

* cited by examiner

*Primary Examiner* — Timothy X Pham
(74) *Attorney, Agent, or Firm* — Guntin & Gust, PLC; Erik Boyd

(57) ABSTRACT

Aspects of the subject disclosure may include, for example, splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; and providing the filtered RF signal to an antenna or a receiver. Other embodiments are disclosed.

20 Claims, 15 Drawing Sheets

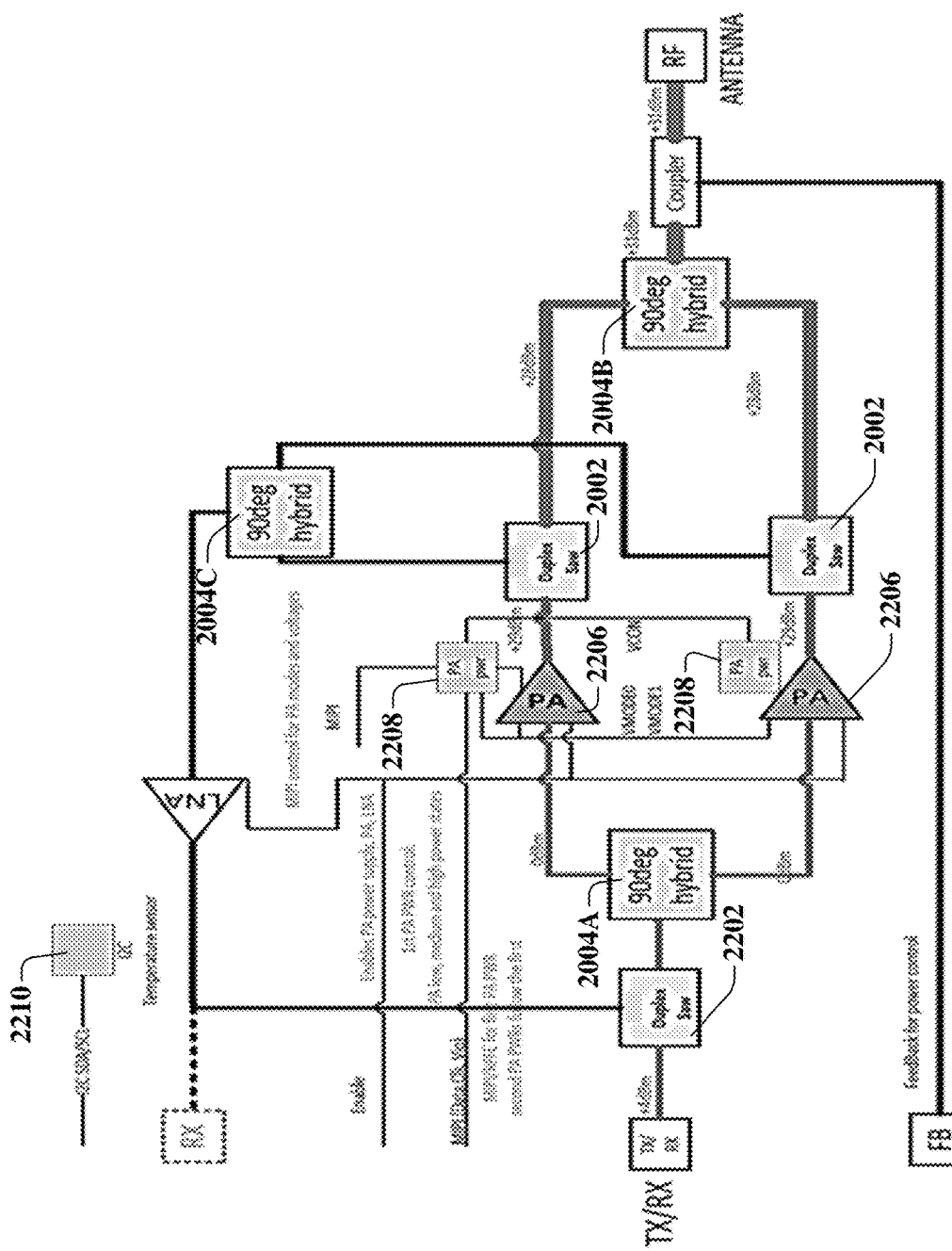
FIG. 2C1

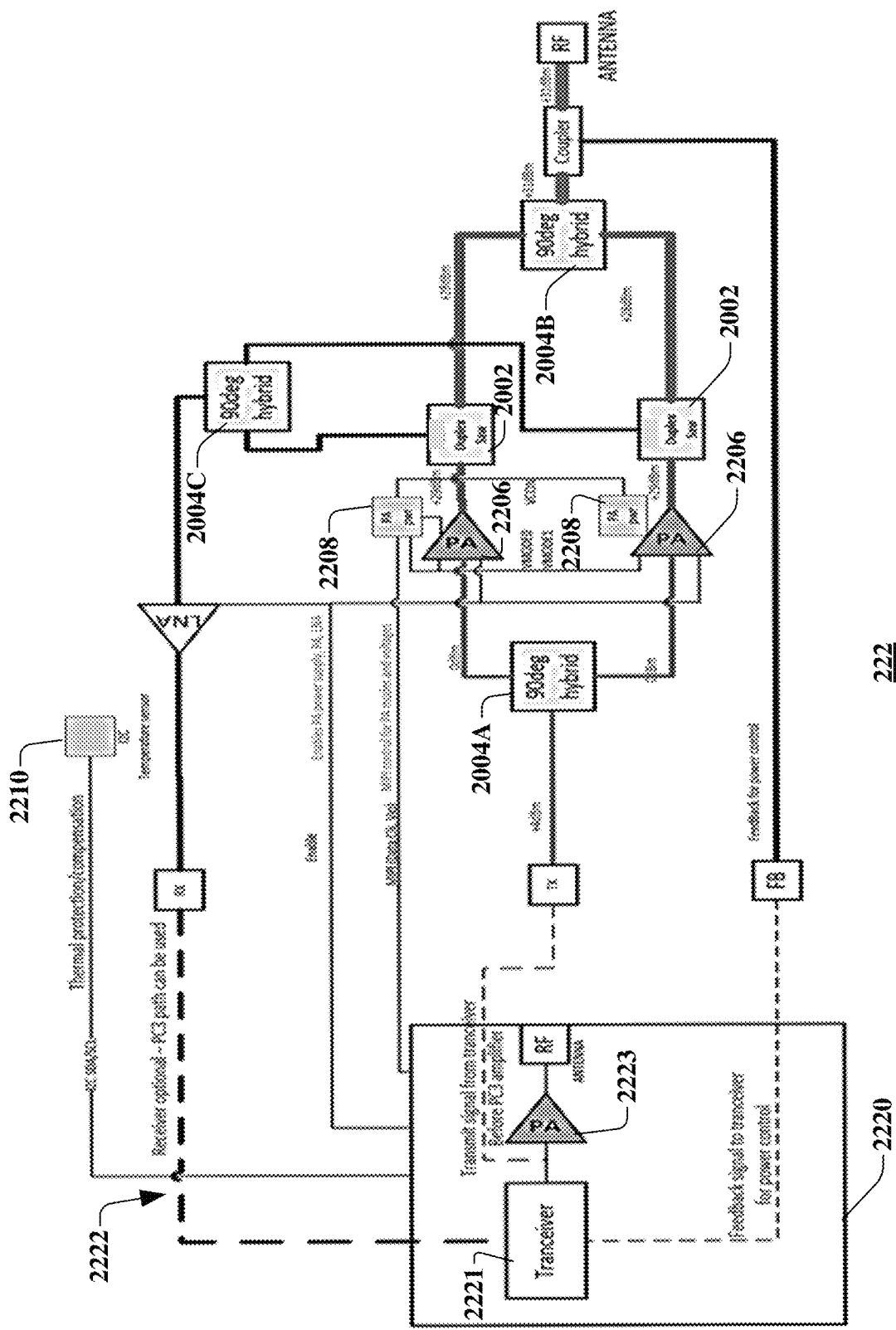
FIG. 2C2

254
FIG. 2E3
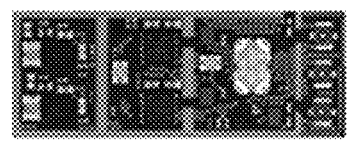
252
FIG. 2E2
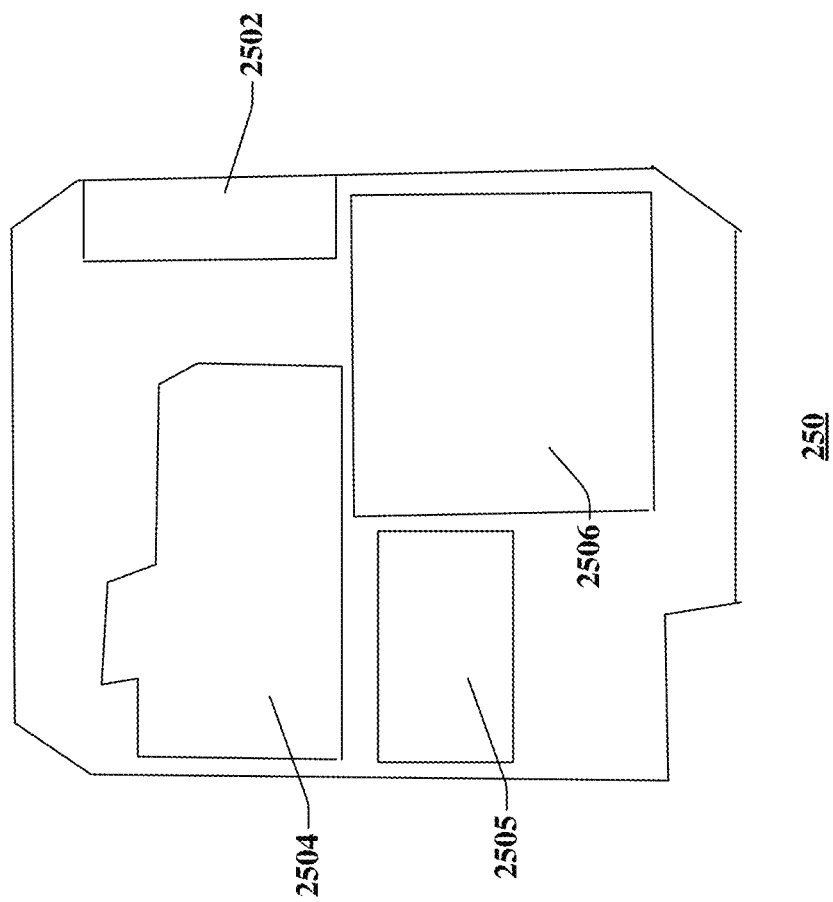
250
FIG. 2E1
PRIOR ART

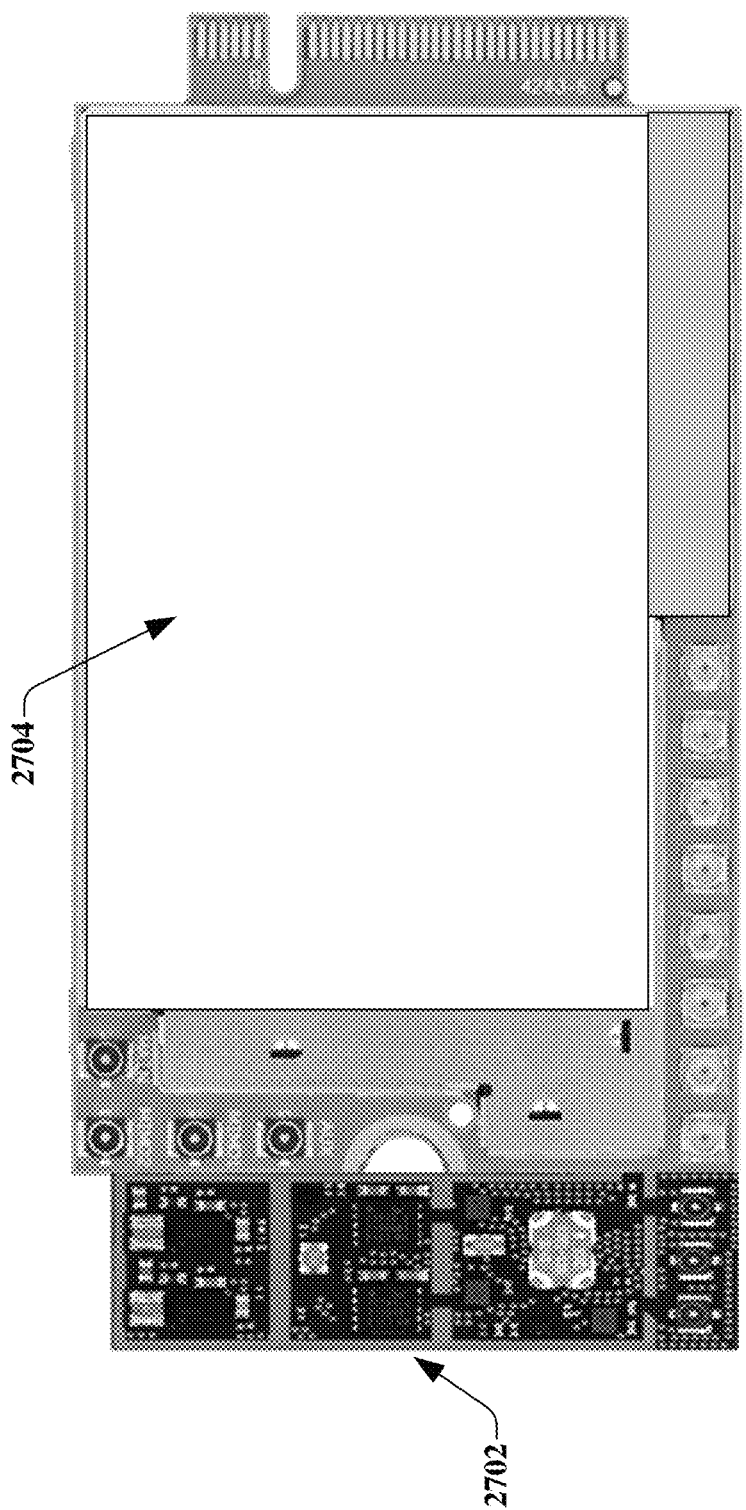
FIG. 2G1

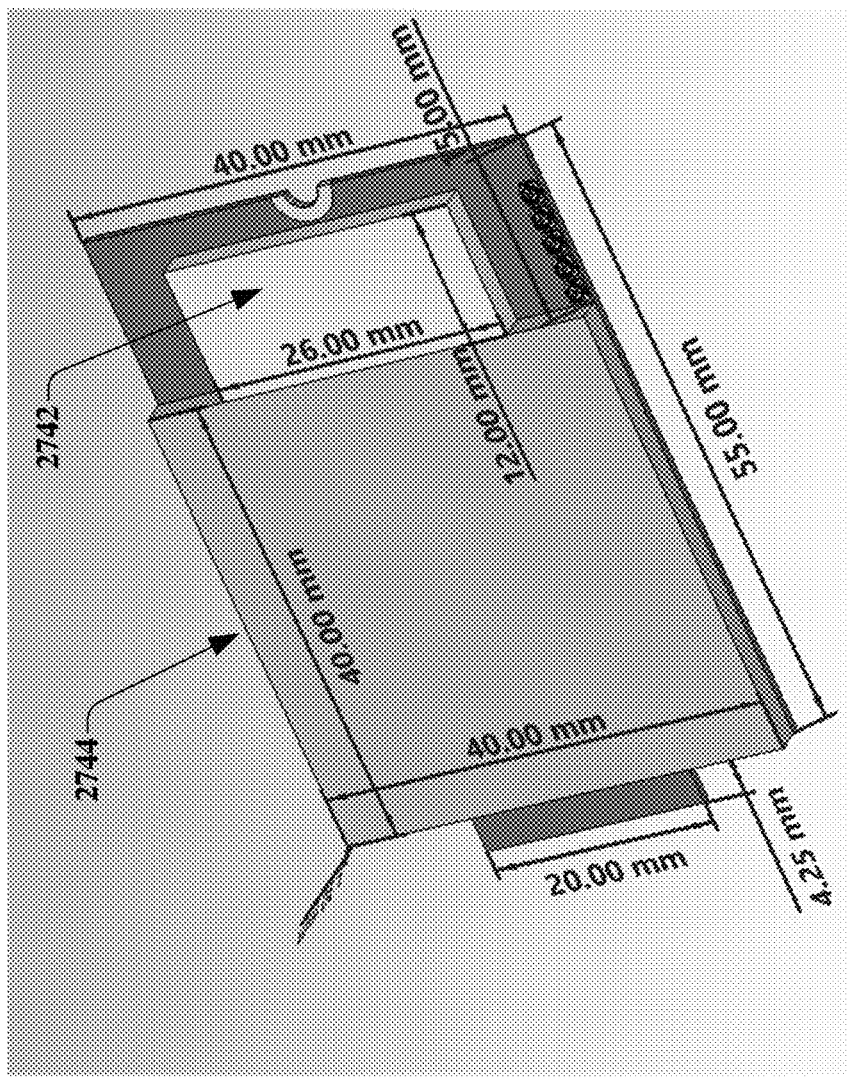
FIG. 2G3
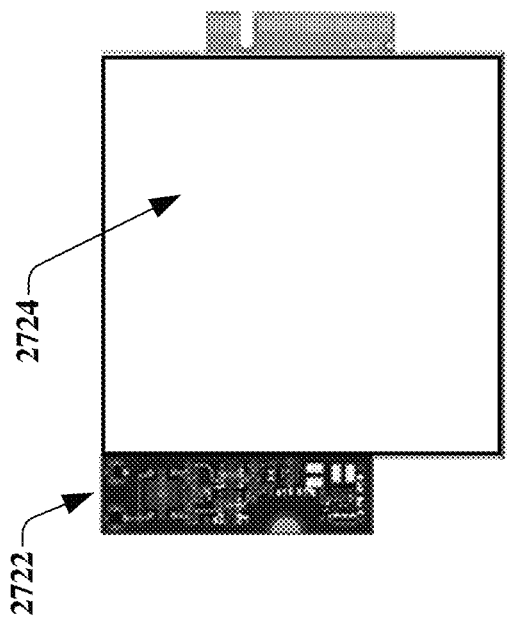
FIG. 2G2

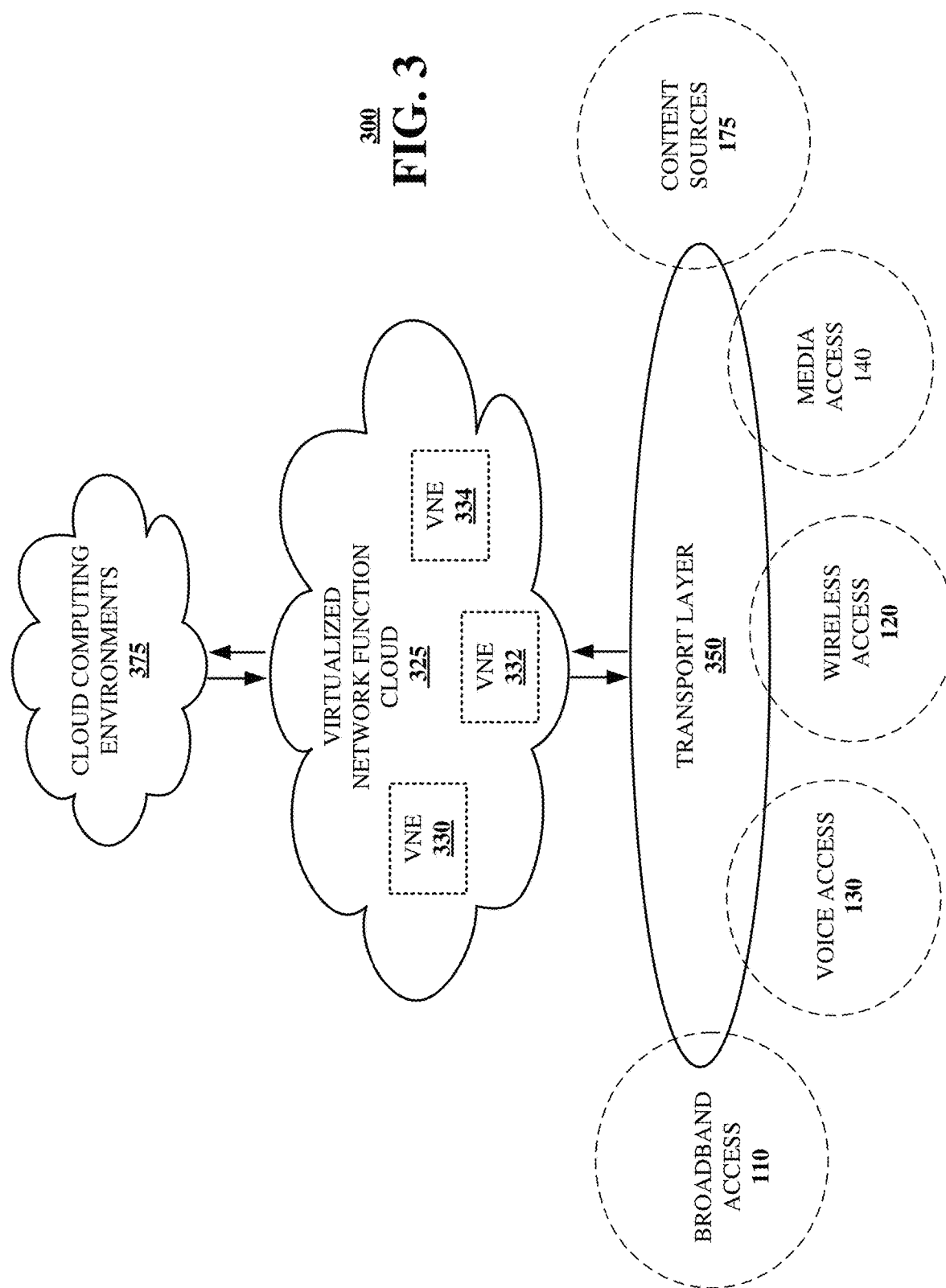

METHOD AND APPARATUS FOR FILTERING AND AMPLIFYING HIGHER POWER COMMUNICATION SIGNALS

FIELD OF THE DISCLOSURE

The subject disclosure relates to a method and apparatus for filtering and amplifying higher power communication signals.

BACKGROUND

Wireless communications are controlled by, or otherwise adhere to, particular standards or protocols that can dictate, or otherwise guide, operations. As an example, the $3^{rd}$ Generation Partnership Project (3GPP) describes different power classes for operation such as User Equipment (UEs) outside of band 14 or 41 in Long-Term Evolution (LTE) communications are only allowed to transmit at a maximum output power of 23 dBm, but while on High Power User Equipment (HPUE) bands (e.g., band 14), the UEs are allowed to transmit with an output power of up to 31 dBm. Specifically, the 3GPP states: "Commercial User Equipment on all bands approved for LTE will operate in power class 3 (+23 dBm). Devices operating in band 14 only may operate in power class 1 which is +31 dBm or 1.25 Watts and band class 2 which is for Time Division Duplex (TDD) as used in Sprint's 2.5 GHz spectrum is limited to +26 dBm or 0.400 watts."

HPUE devices operating on an HPUE band can often provide improved range and coverage over UEs operating on other LTE bands. For instance, first responders can communicate over the FirstNet public safety network by utilizing HPUE devices to provide more robust and reliable communications during emergency situations. The HPUE devices and band are not limited to use by first responders, although priority and pre-emption is applicable.

Output power at the antenna of an HPUE device can be +31 dBm (1.25 W), such that current HPUE devices utilize large ceramic filters to perform duplex filtering. Additionally, such HPUE devices can utilize high power amplifiers with the ceramic filters, which can result in lower efficiency, higher cost, and larger form factors (particularly where one or more shielding structures are needed for the high power amplifiers).

BRIEF DESCRIPTION OF THE DRAWINGS

Reference will now be made to the accompanying drawings, which are not necessarily drawn to scale, and wherein:

FIG. 2C1 is a block diagram illustrating an example, non-limiting embodiment of a portion of a device functioning within the communication network of FIG. 1 in accordance with various aspects described herein.

FIG. 2C2 is a block diagram illustrating an example, non-limiting embodiment of a portion of a device functioning within the communication network of FIG. 1 in accordance with various aspects described herein.

FIG. 2E1 is a schematic illustrating a prior art layout for an HPUE device.

FIG. 2E2 is a schematic illustrating an example, non-limiting embodiment of a portion of a device functioning within the communication network of FIG. 1 in accordance with various aspects described herein.

FIG. 2E3 is a schematic illustrating an example, non-limiting embodiment of a portion of a device functioning within the communication network of FIG. 1 in accordance with various aspects described herein.

FIG. 2G1 is a schematic illustrating an example, non-limiting embodiment of a portion of a device functioning within the communication network of FIG. 1 in accordance with various aspects described herein.

FIG. 2G2 is a schematic illustrating an example, non-limiting embodiment of a portion of a device functioning within the communication network of FIG. 1 in accordance with various aspects described herein.

FIG. 2G3 is a schematic illustrating an example, non-limiting embodiment of a portion of a device functioning within the communication network of FIG. 1 in accordance with various aspects described herein.

FIG. 3 is a block diagram illustrating an example, non-limiting embodiment of a virtualized communication network in accordance with various aspects described herein.

DETAILED DESCRIPTION

Figure 1:
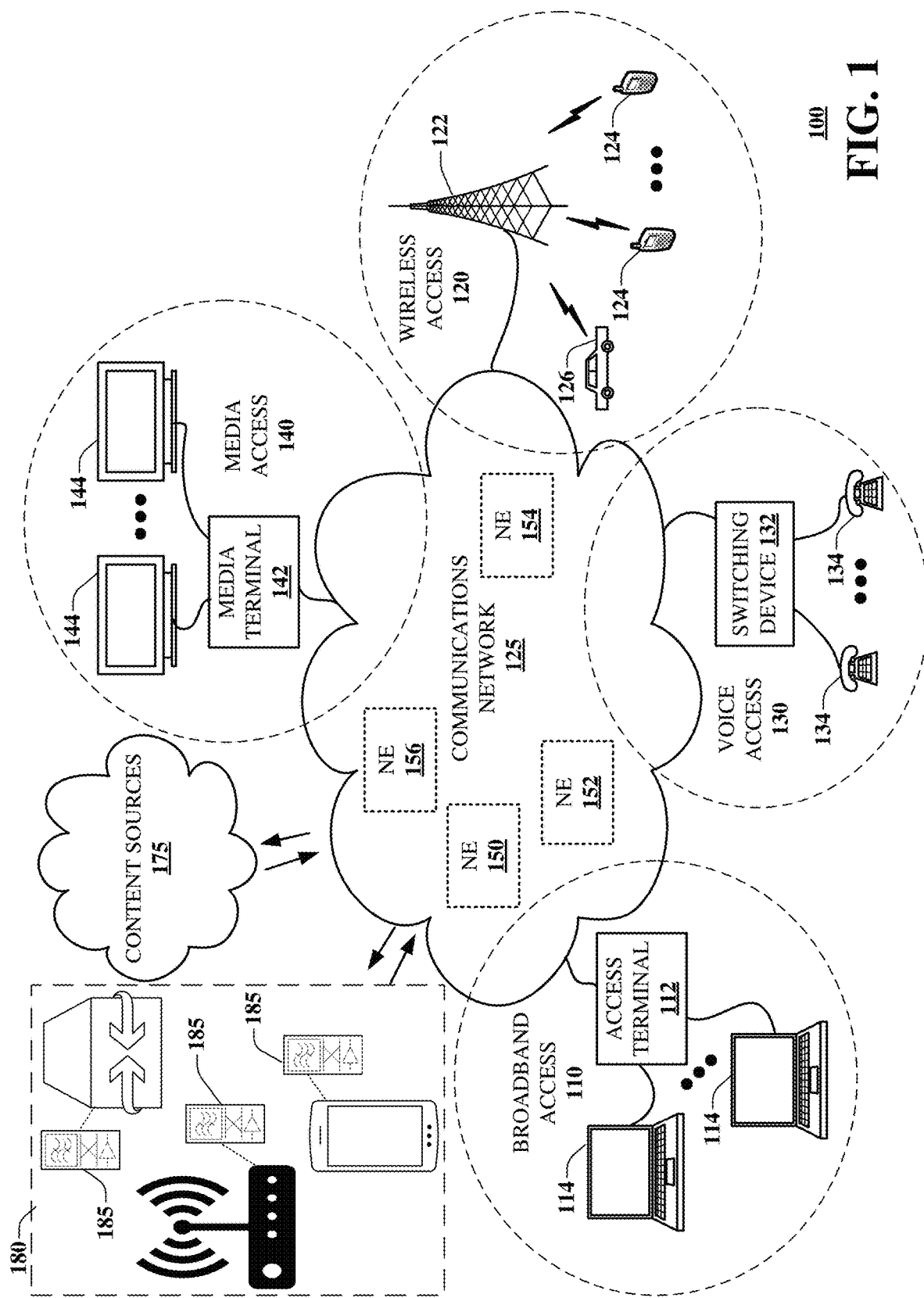
FIG. 1 is a block diagram illustrating an exemplary, non-limiting embodiment of a communications network in accordance with various aspects described herein.

The subject disclosure describes, among other things, illustrative embodiments for providing acoustic wave filtering to facilitate high power wireless communications (e.g., 31 dBm). The filtering can be implemented through splitting or dividing the RF signal(s), such as via hybrid couplers, in order to satisfy the power tolerances of the acoustic wave filters, and recombining of the split, filtered RF signals. In one or more embodiments, cellular power amplifiers rather than high power amplifiers, can be utilized, such as connecting each of the cellular power amplifiers to a corresponding SAW filter. One or more of the exemplary embodiments can be utilized with various power limits, which may be 31 dBm or may be higher. One or more of the exemplary embodiments can utilize particular components, such as cellular power amplifiers, to satisfy linearity requirements or thresholds.

One or more of the exemplary embodiments can utilize filters other than ceramic filters to reduce the needed height and PCB area that is required by ceramic filters. One or more of the exemplary embodiments can utilize filters other than ceramic filters to reduce cost. One or more of the exemplary embodiments can provide devices utilizing particular components described herein resulting in savings of space, reduced power consumption, extended battery life and/or lower cost compared to devices utilizing traditional ceramic filters. In one or more of the exemplary embodiments, the trace lengths, such as between the one, some, or all of the hybrid couplers, SAW filters and/or power amplifiers can be adjusted, or otherwise designed, to employ trace optimization to provide for phase shift accuracy.

One or more of the exemplary embodiments can utilize acoustic wave filtering, signal combining/splitting, cellular power amplifiers and/or switch-mode power supplies to facilitate transmitting and/or receiving in high power operations (e.g., 31 dBm), which can be according to various standards and protocols, including 5G, 6G, and NG. One or more of the exemplary embodiments can utilize a one-to-one relationship of power amplifiers connected to SAW filters, although other embodiments can utilize other configurations including more than one power amplifier connected to each SAW filter and/or SAW filters sharing power amplifiers. Other embodiments are described in the subject disclosure.

One or more aspects of the subject disclosure include a communication device, comprising: an antenna; a receiver; and a filtering system comprising a plurality of Surface Acoustic Wave (SAW) filters connected with a plurality of hybrid couplers. An RF signal can be received at the antenna, where the RF signal is provided to the receiver via the filtering system. One or more first hybrid couplers of the plurality of hybrid couplers can split the RF signal from the antenna into a group of RF signals and provide the group of RF signals to the plurality of SAW filters. The plurality of SAW filters can perform filtering of the group of RF signals resulting in a group of filtered RF signals and can provide the group of filtered RF signals to one or more second hybrid couplers of the plurality of hybrid couplers. The one or more second hybrid couplers can combine the group of filtered RF signals into a filtered RF signal and can provide the filtered RF signal to the receiver.

One or more aspects of the subject disclosure include a device comprising: a plurality of acoustic wave filters; and a plurality of power circuits connected with the acoustic wave filters, where the plurality of power circuits includes one or more RF splitters and one or more RF combiners. The device can be configured for (or otherwise operational for) connection with an antenna and a transmitter, and splitting, by the one or more RF splitters, an RF signal obtained from the transmitter into a group of RF signals. The device can provide, by the one or more RF splitters, the group of RF signals to the plurality of acoustic wave filters, and can filter, by the plurality of acoustic wave filters, the group of RF signals resulting in a group of filtered RF signals. The device can provide, by the plurality of acoustic wave filters, the group of filtered RF signals to the one or more RF combiners, and can combine, by the one or more RF combiners, the group of filtered RF signals into a filtered RF signal. The device can provide, by the one or more RF combiners, the filtered RF signal to the antenna.

One or more aspects of the subject disclosure include a method comprising: splitting, by one or more first hybrid couplers of a device, an RF signal obtained from a transmitter of the device into a group of RF signals; and providing, by the one or more first hybrid couplers, the group of RF signals to a plurality of Surface Acoustic Wave (SAW) filters of the device. The method can include filtering, by the plurality of SAW filters, the group of RF signals resulting in a group of filtered RF signals. The method can include providing, by the plurality of SAW filters, the group of filtered RF signals to one or more second hybrid couplers of the device. The method can include combining, by the one or more second hybrid couplers, the group of filtered RF signals into a filtered RF signal. The method can include providing, by the one or more second hybrid couplers, the filtered RF signal to an antenna of the device.

Referring now to FIG. 1, a block diagram is shown illustrating an example, non-limiting embodiment of a system 100 in accordance with various aspects described herein. System 100 can include communication devices and equipment 180 (e.g., routers, gateways, modems, network elements, mini base stations, portable base stations, vehicle communication systems, end user devices, and various other devices that can facilitate or otherwise provide for wireless communications), which can operate at higher powers (e.g., above 23 dBm such as at 31 dBm or above 31 dBm). In some embodiments, the equipment can operate over a range of powers including below and above 23 dBm and/or below and above 31 dBm. In some embodiments, the equipment can be configured to operate at various power limits that are above 23 dBm and/or above 31 dBm to accommodate protocol/standards requirements (including changes in the future) and/or frequency band requirements. Equipment 180 can be utilized by various users and/or entities including first responders, commercial entities, individual users, government entities, and so forth, such as according to any regulations, standards and protocols that are applicable to their use, which may include priority and pre-emption rules such as based on the frequency band in which they are operating.

In one or more embodiments, equipment 180 can include circuitry or component 185 which can be, or otherwise incorporated into, a front end module. However, in one or more other embodiments the component 185 can be located in whole or in part outside of the front end module or in addition to the front end module, such as a plug-in component that is configured to be connected with various front end modules of various devices, which may be manufactured by a same or different entities (e.g., utilized as an adapter for already produced front end modules).

In one or more embodiments, component 185 includes acoustic wave filters for filtering of received and/or transmitted RF signals. For example, the acoustic wave filters can be SAW filters, although other filters that are capable of filtering can also be utilized such as Bulk Acoustic Wave (BAW) filters. For instance, the component 185 can include two or four SAW filters that each receive one split or divided RF signal that has been split or divided from the RF signal by one or more power circuits, such as hybrid couplers (e.g., a 90 degree hybrid coupler). The power circuits can be combiners, splitters, or other power circuits that facilitate combining and/or dividing RF signals, including equally into two signals and/or into other numbers of signals. In one or more embodiments, other numbers of filters (e.g., eight SAW filters) can be utilized depending on the particular configuration, power parameters, efficiency, QoS requirements, frequency band, standards/protocol requirements, and so forth. In one or more embodiments, other types of combiners, splitters, directional couplers or other components can be utilized for splitting and/or combining the RF signal(s) to and/or from the filters depending on the particular configuration, power parameters, efficiency, QoS requirements, frequency band, standards/protocol requirements, and so forth. The SAW filters of the component 185 can filter the RF signals and then provide the filtered RF signals to one or more other power circuits or hybrid couplers (e.g., a 90 degree hybrid coupler) for combining, which as described herein can be various numbers and/or types of combiners/splitters. The filtered RF signal (which can be a transmit or receive signal) can then be provided to the antenna for transmitting or the receiver for processing.

In one or more embodiments, component 185 includes power amplifiers connected with the filters (e.g., SAW filters). For example, the power amplifiers can be cellular power amplifiers that operate at or up to a particular power limit, such as 28 dBm, although other power amplifiers can be utilized that are capable of amplifying power of an RF signal or a split RF signal that is to be transmitted by the equipment 180. For instance, the component 185 can include two or four power amplifiers that each receive one split or divided RF signal that has been split or divided from the RF signal by the one or more hybrid couplers. In one or more embodiments, other numbers of power amplifiers (e.g., eight power amplifiers) can be utilized depending on the particular configuration, power parameters, efficiency, QoS requirements, frequency band, standards/protocol requirements, and so forth. In one or more embodiments, other types of power amplifiers or other components (e.g., one or more switching (or switch-mode) power supplies such as a switching power supply connected to each power amplifier and/or connected with a controller such as a modem) can be utilized for amplifying and managing power depending on the particular configuration, power parameters, efficiency, QoS requirements, frequency band, standards/protocol requirements, and so forth. The amplified RF signals can then be provided to the SAW filters of the component 185. Power regulation and management can be performed in a number of different ways and/or utilizing various components, including according to Mobile Industry Processor Interface (MIPI) standards/protocols. In one or more embodiments, other power management components, systems, and/or techniques can be employed in the equipment 180 which may or may not include switch-mode power supplies.

In one or more embodiments, equipment 180 can utilize balanced SAW filters for filtering transmit and/or receive RF signals that are first split (e.g., two way or four way split) so that each filter receives only a portion of the total power (e.g., −3 dB less power or −6 dB less power per SAW filter). SAW filter outputs can then be combined to achieve a higher power requirement such as +31 dBm output power for HPUE devices (e.g., communicating on band 14).

In one or more embodiments, equipment 180 can utilize low-cost cellular power amplifiers with high efficiency together with small, low-cost SAW filters by 90-degree quadrature splitting/combining the RF path to obtain enough linear power and satisfy power tolerance. For instance, while a single cellular power amplifier does not have enough output power and linearity to satisfy at the antenna port the HPUE Power Class 1 required +31 dBm after filtering, however, multiple power amplifiers (e.g., two or four) being utilized in parallel with quadrature combiners/splitters can provide enough linear output power for the HPUE Power Class 1 communications. Also, while a single SAW filter does not have enough power tolerance for HPUE Power Class 1 required +31 dBm after filtering, however, multiple SAW filters (e.g., two or four) being utilized in parallel can tolerate +31 dBm. Equipment 180, through use of component 185 that can include quadrature combined cellular power amplifiers and SAW filters, can save space, power consumption, battery life and cost compared to traditional ceramic filter and high-power amplifier devices. In one or more embodiments, equipment 180 can employ MIPI/RFFE controlled power amplifier power supplies so Average Power Tracking (APT) can be performed. APT can improve efficiency by optimizing or improving power amplifier power supply voltage based on an average RF output power.

As an example, system 100 can facilitate in whole or in part splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; providing the filtered RF signal to an antenna or a receiver; and managing power amplification utilizing cellular power amplifiers connected to the SAW filters, which can be controlled via MIPI-based techniques such as via commands from a modem.

In particular, a communications network 125 is presented for providing broadband access 110 to a plurality of data terminals 114 via access terminal 112, wireless access 120 to a plurality of mobile devices 124 and vehicle 126 via base station or access point 122, voice access 130 to a plurality of telephony devices 134, via switching device 132 and/or media access 140 to a plurality of audio/video display devices 144 via media terminal 142. In addition, communication network 125 is coupled to one or more content sources 175 of audio, video, graphics, text and/or other media. While broadband access 110, wireless access 120, voice access 130 and media access 140 are shown separately, one or more of these forms of access can be combined to provide multiple access services to a single client device (e.g., mobile devices 124 can receive media content via media terminal 142, data terminal 114 can be provided voice access via switching device 132, and so on).

The communications network 125 includes a plurality of network elements (NE) 150, 152, 154, 156, etc. for facilitating the broadband access 110, wireless access 120, voice access 130, media access 140 and/or the distribution of content from content sources 175. The communications network 125 can include a circuit switched or packet switched network, a voice over Internet protocol (VoIP) network, Internet protocol (IP) network, a cable network, a passive or active optical network, a 4G, 5G, or higher generation wireless access network, WIMAX network, UltraWideband network, personal area network or other wireless access network, a broadcast satellite network and/or other communications network.

In various embodiments, the access terminal 112 can include a digital subscriber line access multiplexer (DSLAM), cable modem termination system (CMTS), optical line terminal (OLT) and/or other access terminal. The data terminals 114 can include personal computers, laptop computers, netbook computers, tablets or other computing devices along with digital subscriber line (DSL) modems, data over coax service interface specification (DOCSIS) modems or other cable modems, a wireless modem such as a 4G, 5G, or higher generation modem, an optical modem and/or other access devices.

In various embodiments, the base station or access point 122 can include a 4G, 5G, or higher generation base station, an access point that operates via an 802.11 standard such as 802.11n, 802.11ac or other wireless access terminal. The mobile devices 124 can include mobile phones, e-readers, tablets, phablets, wireless modems, and/or other mobile computing devices.

In various embodiments, the switching device 132 can include a private branch exchange or central office switch, a media services gateway, VoIP gateway or other gateway device and/or other switching device. The telephony devices 134 can include traditional telephones (with or without a terminal adapter), VoIP telephones and/or other telephony devices.

In various embodiments, the media terminal 142 can include a cable head-end or other TV head-end, a satellite receiver, gateway or other media terminal 142. The display devices 144 can include televisions with or without a set top box, personal computers and/or other display devices.

In various embodiments, the content sources 175 include broadcast television and radio sources, video on demand platforms and streaming video and audio services platforms, one or more content data networks, data servers, web servers and other content servers, and/or other sources of media.

In various embodiments, the communications network 125 can include wired, optical and/or wireless links and the network elements 150, 152, 154, 156, etc. can include service switching points, signal transfer points, service control points, network gateways, media distribution hubs, servers, firewalls, routers, edge devices, switches and other network nodes for routing and controlling communications traffic over wired, optical and wireless links as part of the Internet and other public networks as well as one or more private networks, for managing subscriber access, for billing and network management and for supporting other network functions.

Figure 2A:
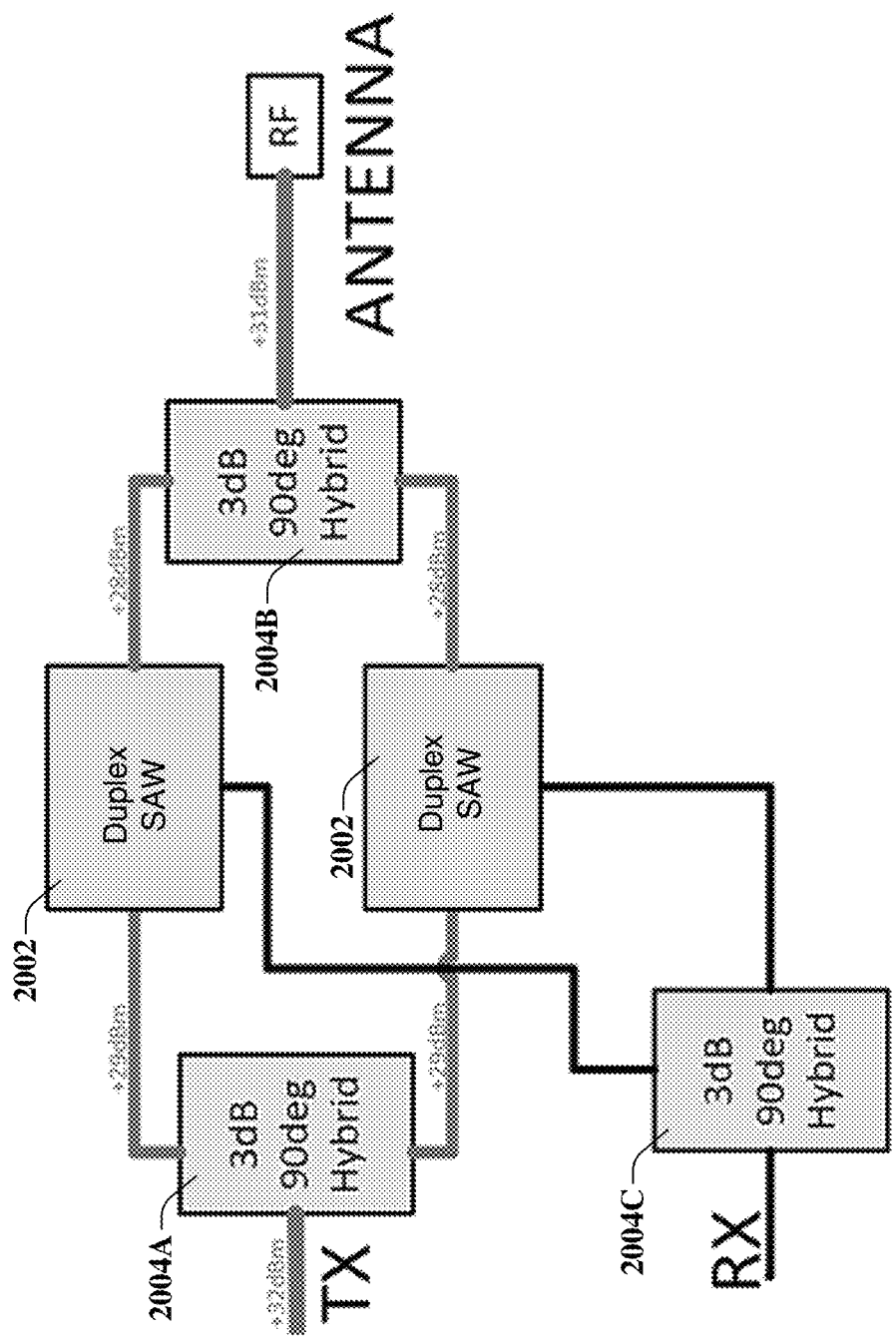
FIG. 2A is a block diagram illustrating an example, non-limiting embodiment of a portion of a device functioning within the communication network of FIG. 1 in accordance with various aspects described herein.

FIG. 2A is a block diagram illustrating an example, non-limiting embodiment of a portion or circuit 200 of a device (e.g., equipment 180) functioning within the communication network of FIG. 1 in accordance with various aspects described herein. Circuit 200 can provide filtering for wireless transmit and/or receive communications including in higher power operations, such as HPUE devices operating in band 14. Circuit 200 can include a number of acoustic wave filters, which are illustrated as duplex SAW filters 2002, for filtering transmit and/or receive RF signals. To facilitate power management in the device, power combiner/splitter circuits 2004 can be utilized for combining and/or splitting the RF signal(s), such as 90 degree hybrid couplers. In this example, a first hybrid coupler 2004A can split an RF signal from a transmitter such as from 32 dBm to a pair of 29 dBm RF signals which are then fed to corresponding SAW filters 2002 for filtering (which is illustrated as an output of 28 dBm). The filtered RF signals can then be combined by hybrid coupler 2004b into a filtered RF signal which is fed to an antenna for transmission (which is illustrated as an output of 31 dBm). Circuit 200 can also perform similar filtering and signal splitting/combining operations of received signals utilizing the components described herein. Through use of hybrid couplers 2004, the circuit 200 can utilize SAW filters that have a lower power tolerance than other types of filters (such as contemporary ceramic filters) but which are more efficient, cost effective, and smaller. The power illustrations along the traces between the inputs and outputs of the components can be approximations which can vary based on various factors including losses, trace lengths, and so forth. Additionally, the power illustrations can change according to the particular power requirements of the device, the configuration and components being utilized for circuit 200, frequency band, standards/protocol requirements, and so forth.

In one or more embodiments, circuit 200 can provide SAW filters together with 3 dB 90 degree hybrid couplers that enable a form factor which is smaller than a contemporary ceramic filter. For example, the height of a contemporary ceramic duplex filter is greater than 7 mm, while balanced SAW filtering in one embodiment can be only 1.8 mm high where the output low-loss hybrid couplers are the highest component (measured in height). As another example, a contemporary ceramic filter occupies a 30×20 mm PCB area, while balanced SAW filtering in one embodiment can utilize approximately a 20×18 mm space (e.g., four paths shown in FIG. 2B) and 10×7 mm space (e.g., two paths shown in FIG. 2A). In one or more embodiments, circuit 200 utilizes two paths which can satisfy a 3GPP PC1 output power level (+31 dBm) and which has been tested and shown to satisfy reliability requirements. In one or more embodiments, circuit 200 utilizes duplex SAW filters which provide a better filtering response, improved rejection for TX noise/nonlinearity, and smaller insertion loss than contemporary ceramic filters. Circuit 200 provides a smaller insertion loss which results in smaller power consumption which further equals higher efficiency, less thermal load, and longer battery life such as for a handheld device. Circuit 200 can utilize SAW filtering which is more cost effective than contemporary ceramic filters.

Figure 2B:
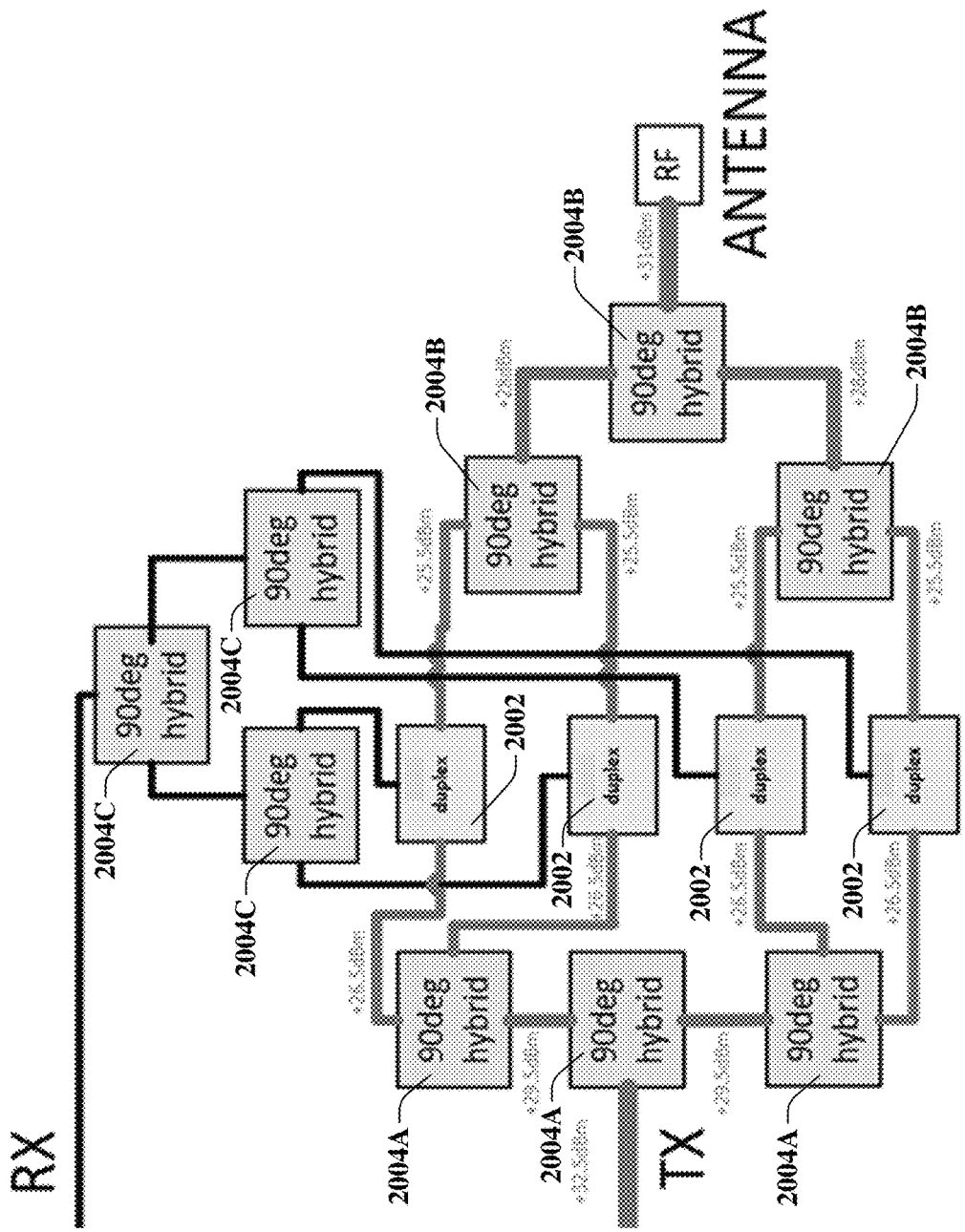
FIG. 2B is a block diagram illustrating an example, non-limiting embodiment of a portion of a device functioning within the communication network of FIG. 1 in accordance with various aspects described herein.

FIG. 2B is a block diagram illustrating an example, non-limiting embodiment of a portion or circuit 210 of a device (e.g., equipment 180) functioning within the communication network of FIG. 1 in accordance with various aspects described herein. Circuit 210 can provide filtering for wireless transmit and/or receive communications including in higher power operations, such as HPUE devices operating in band 14. Circuit 210 can include a number of acoustic wave filters, which are illustrated as duplex SAW filters 2002, for filtering transmit and/or receive RF signals. To facilitate power management in the device, power combiner/splitter circuits 2004 can be utilized for combining and/or splitting the RF signal(s), such as 90 degree hybrid couplers. In this example, four paths to four SAW filters 2002 are utilized where three groups of hybrid couplers 2004A, 2004B and 2004C are utilized for splitting RF signals that are being fed to the SAW filters and combining split RF signals after the filtering has occurred so that the filtered RF signal can be transmitted via an antenna or provided to a receiver. Circuit 210 can also perform filtering and signal splitting/combining operations of transmit and/or receive signals utilizing the components described herein. The power illustrations along the traces between the inputs and outputs of the components can be approximations which can vary based on various factors including losses, trace lengths, and so forth. Additionally, the power illustrations can change according to the particular power requirements of the device, the configuration and components being utilized for circuit 210, frequency band, standards/protocol requirements, and so forth. In one or more embodiments, such as illustrated in FIGS. 2A and 2B, the hybrid couplers 2004A and 2004B can be same low loss components while hybrid couplers 2004C can be a smaller, higher insertion loss, since it is for a receiver.

FIG. 2C1 is a block diagram illustrating an example, non-limiting embodiment of a portion or circuit 220 of a device (e.g., equipment 180) functioning within the communication network of FIG. 1 in accordance with various aspects described herein. Circuit 220 can provide filtering for wireless transmit and/or receive communications including in higher power operations, such as HPUE devices operating in band 14. Circuit 220 can include a number of acoustic wave filters, which are illustrated as duplex SAW filters 2002, for filtering transmit and/or receive RF signals. To facilitate power management in the device, power combiner/splitter circuits 2004 can be utilized for combining and/or splitting the RF signal(s), such as 90 degree hybrid couplers. Circuit 220 can perform filtering and signal splitting/combining operations of received signals utilizing the components described herein. Through use of hybrid couplers 2004, the circuit 220 can utilize SAW filters that have a lower power tolerance than other types of filters (such as contemporary ceramic filters) but which are more efficient, cost effective, and smaller. The power illustrations along the traces between the inputs and outputs of the components can be approximations which can vary based on various factors including losses, trace lengths, and so forth. Additionally, the power illustrations can change according to the particular power requirements of the device, the configuration and components being utilized for circuit 220, frequency band, standards/protocol requirements, and so forth.

As an example along a transmit path of the circuit 220, power amplifiers 2206 can be connected with the acoustic wave filters (e.g., SAW filters) 2002 to amplify the power, such as cellular power amplifiers that can amplify each of the 0 dBm split RF signals to at or about 29 dBm for feeding to the SAW filters. The output at each SAW filter 2002 can be approximately 28 dBm, which, when combining the two paths via hybrid coupler 2004B, provides a 31 dBm signal to be transmitted at the antenna. The power amplifiers 2206 can be managed in a number of different ways. In one embodiment, switching (switch-mode) power supplies 2208 can be connected with the power amplifiers 2206 and with a controller for power management. For instance, MIPI-based power control can be employed, including receiving control signals at the switching power supplies 2208 from the modem (not shown). Other techniques and components can be utilized by circuit 220 for regulating and controlling the power amplifiers 2206, which may or may not include utilizing switching power supplies. In one embodiment, MIPI controlled power circuits enable using average power tracking techniques for the communication device that employs circuit 220.

Circuit 220 can include other components, including a temperature sensor 2210 for adjusting or managing the equipment, including lowering power or shutting off operations when a temperature threshold has been surpassed. Circuit 220 is illustrated with a combined transmitter and receiver, where another filter, such as a SAW filter 2202 can be connected to the hybrid coupler 2004A for filtering of signals. Circuit 220 is also illustrated with a separate receiver, which can be fed received signals from the hybrid coupler 2004C. FIG. 2C can be separate embodiments where there is: a transceiver; a separate transmitter and separate receiver; or a transceiver and a separate receiver. Other components and techniques can be utilized in circuit 220 for filtering, power control, transmitting, receiving, or other functions to be performed by the device that employs circuit 220, such as a low noise amplifier, a feedback circuit for power control, a coupler for providing information to the feedback circuit, various power states for the power amplifiers 2206 (e.g., low, medium and high power states), and so forth.

In one or more embodiments, circuit 220 can provide cellular power amplifiers, SAW filters, 3 dB 90 degree quadrature couplers. and MIPI/RFFE controlled PA power supplies that enable a smaller form factors as compared to contemporary devices that utilize ceramic filters. For example, the height of a ceramic duplex filter is greater than 7.4 mm while in one embodiment the circuit utilizing cellular power amplifiers, quadrature couplers, and SAW filters can be 1.8 mm high (e.g., the output low-loss hybrid couplers being the highest component (measured in height)). As another comparison, a contemporary ceramic filter alone can occupy about a 30×20 mm PCB area, while in one embodiment the circuit utilizing cellular power amplifiers, SAW filters, quadrature combiners and PA power supplies occupies only 30×22 mm area. In other embodiments, the form factor can be an area of 30×12 mm and about 23×8 mm. By comparison, a contemporary RF front end design using high power amplifiers and a ceramic filter is 82×72 mm.

In addition to the advantages of the SAW filters in better filtering response, rejection for TX noise/nonlinearity, smaller insertion loss, smaller power consumption, higher efficiency, less thermal load, longer battery life for handheld device, and lower cost as compared to contemporary ceramic filter designs, circuit 220 can utilize cellular power amplifiers that are lower cost as compared to high power amplifiers (e.g., traditional base station driver PAs). Circuit 220 enables power consumption that is lower than the contemporary devices utilizing ceramic filters and high power amplifiers (see FIG. 2F).

FIG. 2C2 is a block diagram illustrating an example, non-limiting embodiment of a portion or circuit 222 of a device (e.g., equipment 180) functioning within the communication network of FIG. 1 in accordance with various aspects described herein. Circuit 222 can provide filtering for wireless transmit and/or receive communications including in higher power operations, such as HPUE devices operating in band 14. Circuit 222 illustrates a modem 2220 that is connected with filtering and power components, including a number of acoustic wave filters 2002 (e.g., duplex SAW filters) for filtering transmit and/or receive RF signals, a number of power combiner/splitter circuits 2004 (e.g., 90 degree hybrid couplers) for combining and/or splitting the RF signal(s) fed to or received from the filters, a number of power amplifiers 2206 (e.g., cellular power amplifiers), and a number of power management components/circuits 2208 (e.g., switching (switch-mode) power supplies) that can be connected with the power amplifiers and with a controller (e.g., modem 2220) for power management. Other techniques and components can be utilized by circuit 222 for regulating and controlling the power amplifiers 2206, which may or may not include utilizing switching power supplies. Circuit 222 can include other components, such as a feedback for power control that provides a feedback signal to the transceiver 2221, as well as a temperature sensor 2210 for adjusting or managing the equipment, including lowering power or shutting off operations when a temperature threshold has been surpassed. In one or more embodiments, circuit 222 can include a receiver path 2222 (which includes various components that facilitate or enable receiving RF signals), such as for power class three operations, in addition to the transceiver 2221. In one or more embodiments, other components can also be utilized including a power class three power amplifier 2223, which the transceiver 2221 can bypass for power class one operations (e.g., HPUE operations).

Figure 2D:
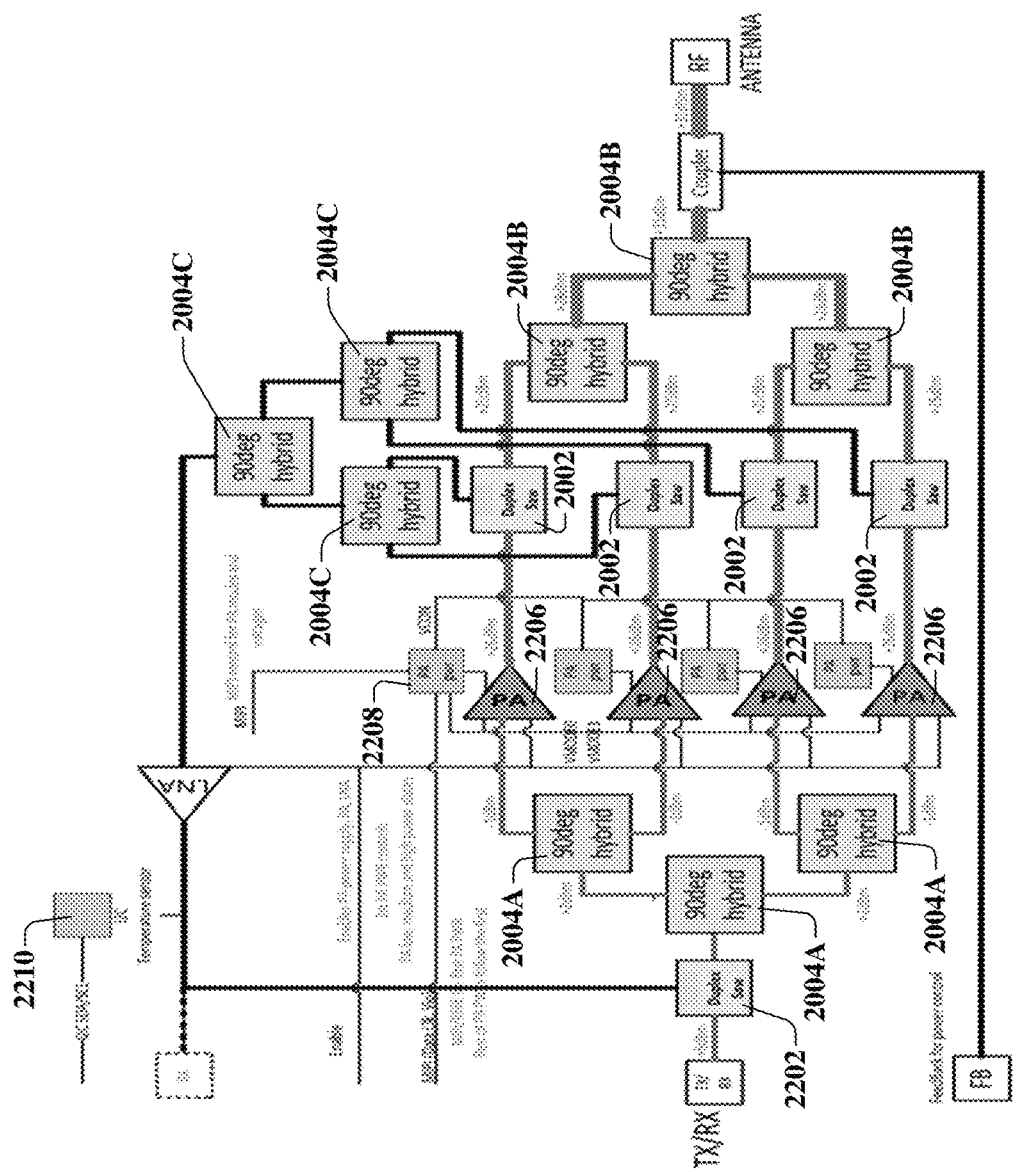
FIG. 2D is a block diagram illustrating an example, non-limiting embodiment of a portion of a device functioning within the communication network of FIG. 1 in accordance with various aspects described herein.

FIG. 2D is a block diagram illustrating an example, non-limiting embodiment of a portion or circuit 230 of a device (e.g., equipment 180) functioning within the communication network of FIG. 1 in accordance with various aspects described herein. Circuit 230 can provide filtering for wireless transmit and/or receive communications including in higher power operations, such as HPUE devices operating in band 14. Circuit 230 can include a number of acoustic wave filters, which are illustrated as duplex SAW filters 2002, for filtering transmit and/or receive RF signals. To facilitate power management in the device, power combiner/splitter circuits 2004 can be utilized for combining and/or splitting the RF signal(s), such as 90 degree hybrid couplers, along with cellular power amplifiers 2206 and power circuits 2208 (e.g., switching power supplies. In this example, four paths to four SAW filters 2002 are utilized where three groups of hybrid couplers 2004A, 2004B and 2004C are utilized for splitting RF signals that are being fed to the SAW filters and combining split RF signals after the filtering has occurred so that the filtered RF signal can be transmitted via an antenna or provided to a receiver. Circuit 230 can also perform filtering and signal splitting/combining operations of transmit and/or receive signals utilizing the components described herein. The power illustrations along the traces between the inputs and outputs of the components can be approximations which can vary based on various factors including losses, trace lengths, and so forth. Additionally, the power illustrations can change according to the particular power requirements of the device, the configuration and components being utilized for circuit 230, frequency band, standards/protocol requirements, and so forth. In FIGS. 2A, 2B, 2C and 2D a duplex filter is illustrated, however, one or more of the exemplary embodiments can operate where the whole HPUE RF front end could work without its own receiver path by utilizing, for example, a modem PC3 path for the receiver. For instance, no duplex filter would be needed and instead just a TX signal filter would be employed or otherwise included. In one or more embodiments, such as illustrated in FIGS. 2C and 2D, the hybrid couplers 2004A and 2004C can be a same, smaller component, with higher insertion loss while hybrid coupler 2004B can be a more efficient, smaller insertion loss component since it is after the amplifiers 2206. However, in other embodiments, the same hybrid couplers can be utilized for the input side (2004A) and the receiver (2004B). In one or more embodiments, such as illustrated in FIGS. 2C and 2D, all of the SAW filters can be a same component.

FIG. 2E1 is a schematic illustrating a prior art layout 250 for a prior art HPUE device. Layout 250 includes a ceramic filter 2502, a power amplifying circuit 2504, a power supply 2505 for the power amplifying circuit, and a modem 2506. These features of layout 250, including the power supply 2505 contribute to the large form factor of the prior art which is utilized in the prior art RF front end. FIG. 2E2 is a schematic illustrating an example, non-limiting embodiment of a portion or circuit 252 of a device (e.g., equipment 180) functioning within the communication network of FIG. 1 in accordance with various aspects described herein. FIG. 2E3 is a schematic illustrating an example, non-limiting embodiment of a portion or circuit 254 of a device (e.g., equipment 180) functioning within the communication network of FIG. 1 in accordance with various aspects described herein. For comparison, the prior art layout 250 (with modem) occupies 82×72 mm area or 5904 mm² while the embodiment of circuit 252 occupies 12×31 mm area or 372 mm² (without modem) and while the embodiment of circuit 254 occupies 8×23 mm area or 184 mm² (without modem). In one or more embodiments, the RF front end that utilizes, for example, circuit 252 or circuit 254 (or other exemplary components and/or circuits described herein), can include a power supply for the power amplifiers (e.g., cellular power amplifiers) that are positioned on top of the board.

Figure 2F:
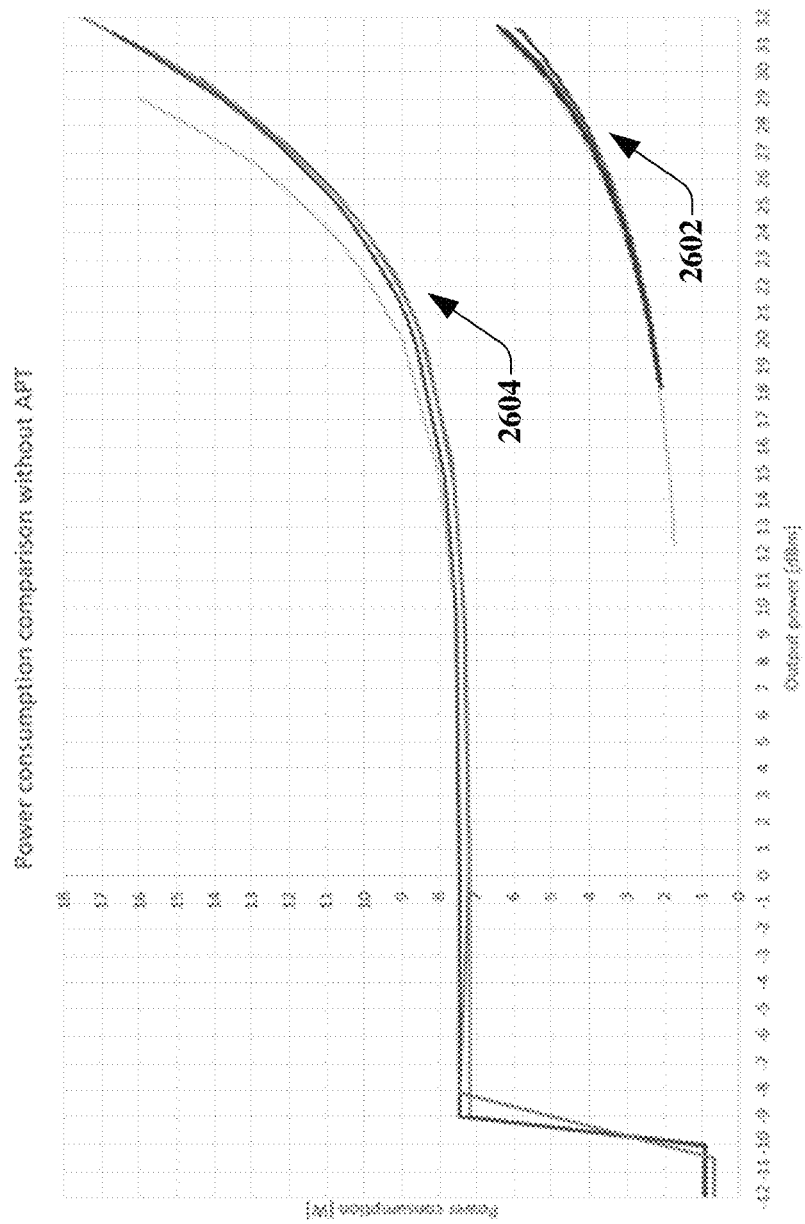
FIG. 2F is a graphical illustration comparing power consumption to output power between contemporary devices and example, non-limiting embodiments of devices in accordance with various aspects described herein.

FIG. 2F is a graphical illustration comparing power consumption to output power between contemporary devices 2604 (utilizing a ceramic filter and high power amplifier) and exemplary embodiments of devices 2602 in accordance with various aspects described herein where the devices 2602 include SAW filters, hybrid couplers and cellular power amplifiers. As can be seen from graph 260, at an output power of 31 dBm, the exemplary devices 2602 have a significantly lower power consumption (about 5 to 6 Watts) as compared to the contemporary device 2604 (about 16 Watts).

FIG. 2G1 is a schematic illustrating an example, non-limiting embodiment of a component 270 of a device (e.g., equipment 180) functioning within the communication network of FIG. 1 in accordance with various aspects described herein. Component 270 includes a circuit 2702 having SAW filters, hybrid couplers and cellular power amplifiers in accordance with one or more of the embodiments described herein, which is further connected with a modem 2704. In this example, the modem 2704 is a 5G modem which occupies a space of 52×30 mm while the circuit 2702 occupies a space of about 8×28 mm.

FIG. 2G2 is a schematic illustrating an example, non-limiting embodiment of a component 272 of a device (e.g., equipment 180) functioning within the communication network of FIG. 1 in accordance with various aspects described herein. Component 272 includes a circuit 2722 having SAW filters, hybrid couplers and cellular power amplifiers in accordance with one or more of the embodiments described herein, which is further connected with a modem 2724. In this example, the modem 2724 is a 5G modem and the component 272 occupies a space of about 52×40 mm or 2080 mm² while the contemporary component 250 that includes a ceramic filter, high power amplifier and modem shown in FIG. 2E1 occupies a space of about 82×72 mm area or 5904 mm². Other dimensions can also be utilized for the component 272, including occupying a space of about 70×40 mm or 60×40 mm.

FIG. 2G3 is a schematic illustrating an example, non-limiting embodiment of a component 274 of a device (e.g., equipment 180) functioning within the communication network of FIG. 1 in accordance with various aspects described herein. Component 274 includes a circuit 2742 having SAW filters, hybrid couplers and cellular power amplifiers in accordance with one or more of the embodiments described herein, which is further connected with a modem 2744. In this example, the modem 2704 is a 5G modem which occupies a space of 40×40 mm while the circuit 2742 occupies a space of about 12×26 mm.

Various other layouts, configurations and dimensions can be used in one or more embodiments described herein while providing high power communications (e.g., 31 dBm).

Figure 2H:
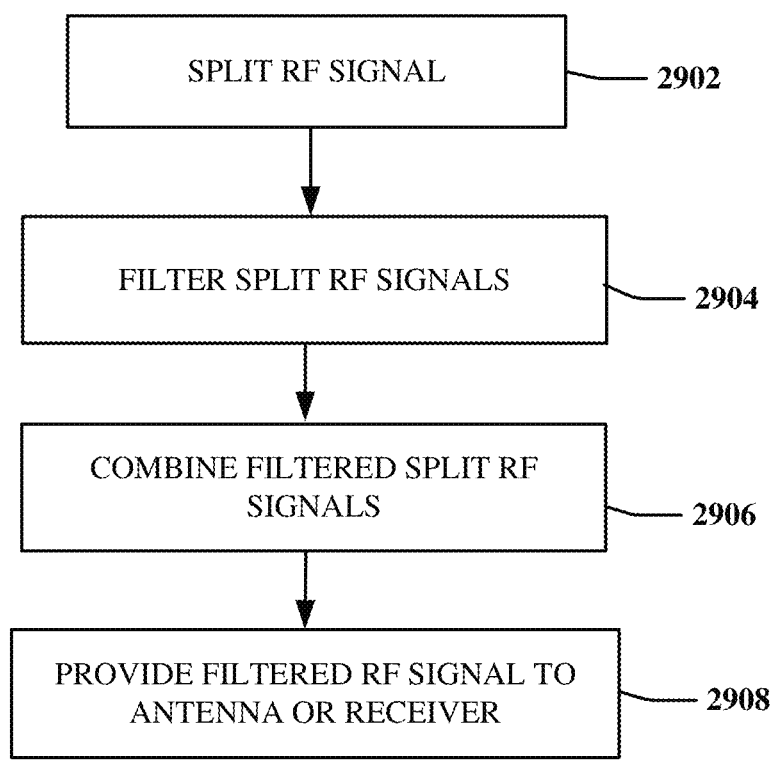
FIG. 2H depicts an illustrative embodiment of a method in accordance with various aspects described herein.

FIG. 2H depicts an illustrative embodiment of a method 290 in accordance with various aspects described herein. At 2902, an RF signal can be split, by one or more first RF circuits (e.g., hybrid couplers) of a device, into a group of RF signals. For example, the RF signal can be obtained from a transmitter or an antenna of the device. The split RF signals at 2904 can then be provided to acoustic wave filters for filtering. For example, first hybrid couplers can provide the group of RF signals to a plurality of SAW filters where filtering occurs. At 2906, the group of filtered RF signals can then be combined into a filtered RF signal by one or more second RF circuits (e.g., hybrid couplers) of the device. At 2908, the filtered RF signal can then be provided to an antenna or receiver of the device (depending on whether the RF signal was a transmit or receive signal).

In one embodiment, method 290 can include splitting, by the one or more second hybrid couplers, a second RF signal obtained from the antenna into a group of second RF signals; providing, by the one or more second hybrid couplers, the group of second RF signals to the plurality of SAW filters; filtering, by the plurality of SAW filters, the group of second RF signals resulting in a group of filtered second RF signals; providing, by the plurality of SAW filters, the group of second filtered RF signals to one or more third hybrid couplers of the device; combining, by the one or more third hybrid couplers, the group of filtered RF signals into a filtered RF signal; and providing, by the one or more third hybrid couplers, the filtered RF signal to a receiver of the device.

In one embodiment, method 290 can include receiving control signals at a plurality of power amplifiers of the device from a modem of the device, where the providing the group of RF signals by the one or more first hybrid couplers to the plurality of SAW filters is by way of the plurality of power amplifiers that are each connected to a corresponding one of the plurality of SAW filters.

One or more of the exemplary embodiments can be utilized on various bands that allow for high power operation, such as band 14 and in Barbados (e.g., Neptune).

While for purposes of simplicity of explanation, the respective processes are shown and described as a series of blocks in FIG. 2H, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Referring now to FIG. 3, a block diagram 300 is shown illustrating an example, non-limiting embodiment of a virtualized communication network in accordance with various aspects described herein. In particular a virtualized communication network is presented that can be used to implement some or all of the subsystems and functions of system 100, the subsystems and functions (and resulting performance data) of the devices, systems and methods presented in FIGS. 1, 2A-2D, 2E2-2H and 3. For example, virtualized communication network 300 can facilitate in whole or in part splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; providing the filtered RF signal to an antenna or a receiver; and managing power amplification utilizing cellular power amplifiers connected to the SAW filters, which can be controlled via MIPI-based techniques such as via commands from a modem.

In particular, a cloud networking architecture is shown that leverages cloud technologies and supports rapid innovation and scalability via a transport layer 350, a virtualized network function cloud 325 and/or one or more cloud computing environments 375. In various embodiments, this cloud networking architecture is an open architecture that leverages application programming interfaces (APIs); reduces complexity from services and operations; supports more nimble business models; and rapidly and seamlessly scales to meet evolving customer requirements including traffic growth, diversity of traffic types, and diversity of performance and reliability expectations.

In contrast to traditional network elements—which are typically integrated to perform a single function, the virtualized communication network employs virtual network elements (VNEs) 330, 332, 334, etc. that perform some or all of the functions of network elements 150, 152, 154, 156, etc. For example, the network architecture can provide a substrate of networking capability, often called Network Function Virtualization Infrastructure (NFVI) or simply infrastructure that is capable of being directed with software and Software Defined Networking (SDN) protocols to perform a broad variety of network functions and services. This infrastructure can include several types of substrates. The most typical type of substrate being servers that support Network Function Virtualization (NFV), followed by packet forwarding capabilities based on generic computing resources, with specialized network technologies brought to bear when general purpose processors or general purpose integrated circuit devices offered by merchants (referred to herein as merchant silicon) are not appropriate. In this case, communication services can be implemented as cloud-centric workloads.

As an example, a traditional network element 150 (shown in FIG. 1), such as an edge router can be implemented via a VNE 330 composed of NFV software modules, merchant silicon, and associated controllers. The software can be written so that increasing workload consumes incremental resources from a common resource pool, and moreover so that it's elastic: so the resources are only consumed when needed. In a similar fashion, other network elements such as other routers, switches, edge caches, and middle-boxes are instantiated from the common resource pool. Such sharing of infrastructure across a broad set of uses makes planning and growing infrastructure easier to manage.

In an embodiment, the transport layer 350 includes fiber, cable, wired and/or wireless transport elements, network elements and interfaces to provide broadband access 110, wireless access 120, voice access 130, media access 140 and/or access to content sources 175 for distribution of content to any or all of the access technologies. In particular, in some cases a network element needs to be positioned at a specific place, and this allows for less sharing of common infrastructure. Other times, the network elements have specific physical layer adapters that cannot be abstracted or virtualized, and might require special DSP code and analog front-ends (AFEs) that do not lend themselves to implementation as VNEs 330, 332 or 334. These network elements can be included in transport layer 350.

The virtualized network function cloud 325 interfaces with the transport layer 350 to provide the VNEs 330, 332, 334, etc. to provide specific NFVs. In particular, the virtualized network function cloud 325 leverages cloud operations, applications, and architectures to support networking workloads. The virtualized network elements 330, 332 and 334 can employ network function software that provides either a one-for-one mapping of traditional network element function or alternately some combination of network functions designed for cloud computing. For example, VNEs 330, 332 and 334 can include route reflectors, domain name system (DNS) servers, and dynamic host configuration protocol (DHCP) servers, system architecture evolution (SAE) and/or mobility management entity (MME) gateways, broadband network gateways, IP edge routers for IP-VPN, Ethernet and other services, load balancers, distributers and other network elements. Because these elements don't typically need to forward large amounts of traffic, their workload can be distributed across a number of servers—each of which adds a portion of the capability, and overall which creates an elastic function with higher availability than its former monolithic version. These virtual network elements 330, 332, 334, etc. can be instantiated and managed using an orchestration approach similar to those used in cloud compute services.

The cloud computing environments 375 can interface with the virtualized network function cloud 325 via APIs that expose functional capabilities of the VNEs 330, 332, 334, etc. to provide the flexible and expanded capabilities to the virtualized network function cloud 325. In particular, network workloads may have applications distributed across the virtualized network function cloud 325 and cloud computing environment 375 and in the commercial cloud, or might simply orchestrate workloads supported entirely in NFV infrastructure from these third party locations.

Figure 4:
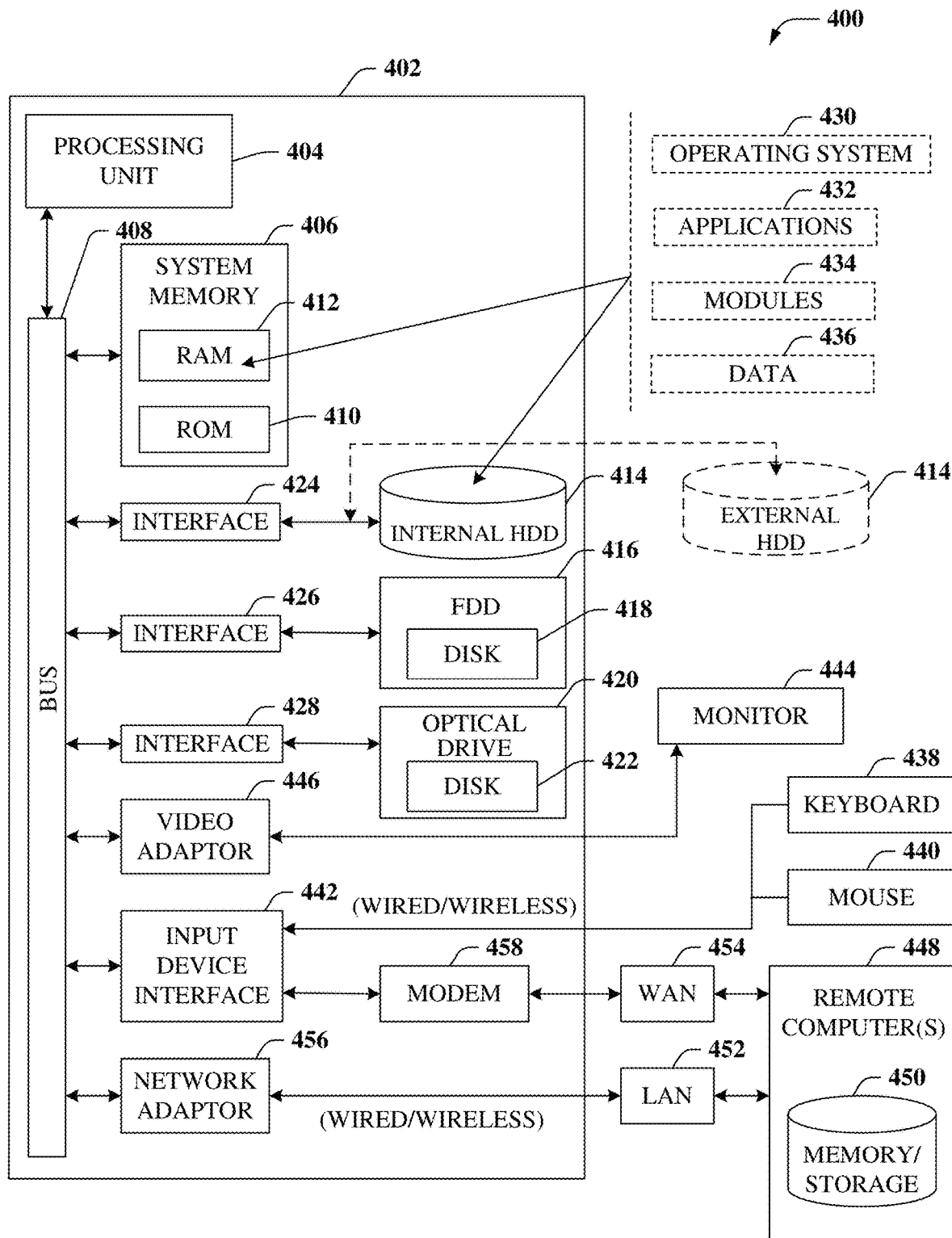
FIG. 4 is a block diagram of an example, non-limiting embodiment of a computing environment in accordance with various aspects described herein.

Turning now to FIG. 4, there is illustrated a block diagram of a computing environment in accordance with various aspects described herein. In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of network elements 150, 152, 154, 156, access terminal 112, base station or access point 122, switching device 132, media terminal 142, and/or VNEs 330, 332, 334, etc. Each of these devices can be implemented via computer-executable instructions that can run on one or more computers, and/or in combination with other program modules and/or as a combination of hardware and software. For example, computing environment 400 can facilitate in whole or in part splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; providing the filtered RF signal to an antenna or a receiver; and managing power amplification utilizing cellular power amplifiers connected to the SAW filters, which can be controlled via MIPI-based techniques such as via commands from a modem.

Generally, program modules comprise routines, programs, components, data structures, etc., that perform particular tasks or implement particular abstract data types. Moreover, those skilled in the art will appreciate that the methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communication network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 5:
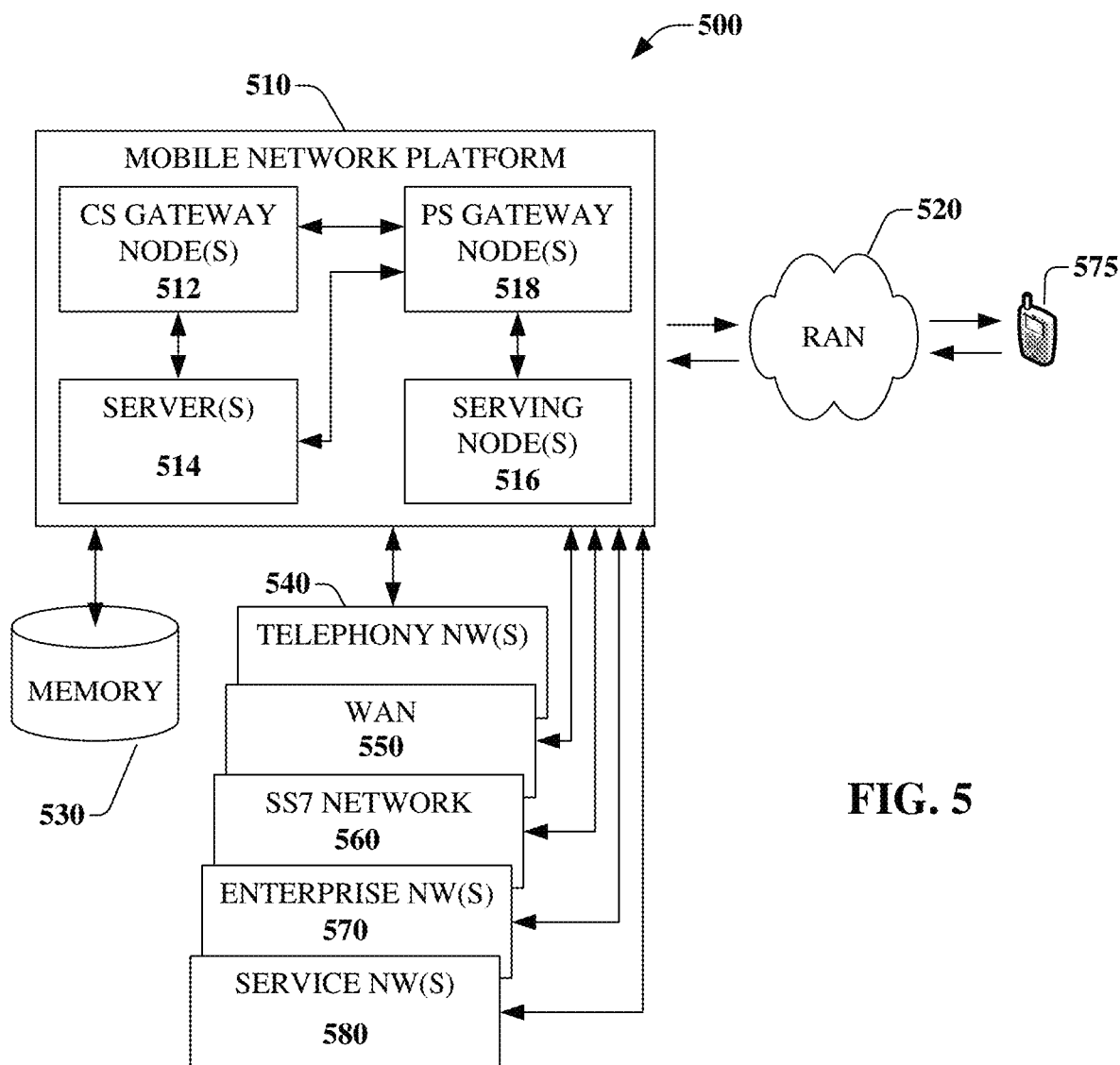
FIG. 5 is a block diagram of an example, non-limiting embodiment of a mobile network platform in accordance with various aspects described herein.

Turning now to FIG. 5, an embodiment 500 of a mobile network platform 510 is shown that is an example of network elements 150, 152, 154, 156, and/or VNEs 330, 332, 334, etc. For example, platform 510 can facilitate in whole or in part splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; providing the filtered RF signal to an antenna or a receiver; and managing power amplification utilizing cellular power amplifiers connected to the SAW filters, which can be controlled via MIPI-based techniques such as via commands from a modem.

In one or more embodiments, the mobile network platform 510 can generate and receive signals transmitted and received by base stations or access points such as base station or access point 122. Generally, mobile network platform 510 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, mobile network platform 510 can be included in telecommunications carrier networks, and can be considered carrier-side components as discussed elsewhere herein. Mobile network platform 510 comprises CS gateway node(s) 512 which can interface CS traffic received from legacy networks like telephony network(s) 540 (e.g., public switched telephone network (PSTN), or public land mobile network (PLMN)) or a signaling system #7 (SS7) network 560. CS gateway node(s) 512 can authorize and authenticate traffic (e.g., voice) arising from such networks. Additionally, CS gateway node(s) 512 can access mobility, or roaming, data generated through SS7 network 560; for instance, mobility data stored in a visited location register (VLR), which can reside in memory 530. Moreover, CS gateway node(s) 512 interfaces CS-based traffic and signaling and PS gateway node(s) 518. As an example, in a 3GPP UMTS network, CS gateway node(s) 512 can be realized at least in part in gateway GPRS support node(s) (GGSN). It should be appreciated that functionality and specific operation of CS gateway node(s) 512, PS gateway node(s) 518, and serving node(s) 516, is provided and dictated by radio technology(ies) utilized by mobile network platform 510 for telecommunication over a radio access network 520 with other devices, such as a radiotelephone 575.

In addition to receiving and processing CS-switched traffic and signaling, PS gateway node(s) 518 can authorize and authenticate PS-based data sessions with served mobile devices. Data sessions can comprise traffic, or content(s), exchanged with networks external to the mobile network platform 510, like wide area network(s) (WANs) 550, enterprise network(s) 570, and service network(s) 580, which can be embodied in local area network(s) (LANs), can also be interfaced with mobile network platform 510 through PS gateway node(s) 518. It is to be noted that WANs 550 and enterprise network(s) 570 can embody, at least in part, a service network(s) like IP multimedia subsystem (IMS). Based on radio technology layer(s) available in technology resource(s) or radio access network 520, PS gateway node(s) 518 can generate packet data protocol contexts when a data session is established; other data structures that facilitate routing of packetized data also can be generated. To that end, in an aspect, PS gateway node(s) 518 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 500, mobile network platform 510 also comprises serving node(s) 516 that, based upon available radio technology layer(s) within technology resource(s) in the radio access network 520, convey the various packetized flows of data streams received through PS gateway node(s) 518. It is to be noted that for technology resource(s) that rely primarily on CS communication, server node(s) can deliver traffic without reliance on PS gateway node(s) 518; for example, server node(s) can embody at least in part a mobile switching center. As an example, in a 3GPP UMTS network, serving node(s) 516 can be embodied in serving GPRS support node(s) (SGSN).

For radio technologies that exploit packetized communication, server(s) 514 in mobile network platform 510 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by mobile network platform 510. Data streams (e.g., content(s) that are part of a voice call or data session) can be conveyed to PS gateway node(s) 518 for authorization/authentication and initiation of a data session, and to serving node(s) 516 for communication thereafter. In addition to application server, server(s) 514 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through mobile network platform 510 to ensure network's operation and data integrity in addition to authorization and authentication procedures that CS gateway node(s) 512 and PS gateway node(s) 518 can enact. Moreover, provisioning server(s) can provision services from external network(s) like networks operated by a disparate service provider; for instance, WAN 550 or Global Positioning System (GPS) network(s) (not shown). Provisioning server(s) can also provision coverage through networks associated to mobile network platform 510 (e.g., deployed and operated by the same service provider), such as the distributed antennas networks shown in FIG. 1(s) that enhance wireless service coverage by providing more network coverage.

It is to be noted that server(s) 514 can comprise one or more processors configured to confer at least in part the functionality of mobile network platform 510. To that end, the one or more processor can execute code instructions stored in memory 530, for example. It is should be appreciated that server(s) 514 can comprise a content manager, which operates in substantially the same manner as described hereinbefore.

In example embodiment 500, memory 530 can store information related to operation of mobile network platform 510. Other operational information can comprise provisioning information of mobile devices served through mobile network platform 510, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 530 can also store information from at least one of telephony network(s) 540, WAN 550, SS7 network 560, or enterprise network(s) 570. In an aspect, memory 530 can be, for example, accessed as part of a data store component or as a remotely connected memory store.

In order to provide a context for the various aspects of the disclosed subject matter, FIG. 5, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 6:
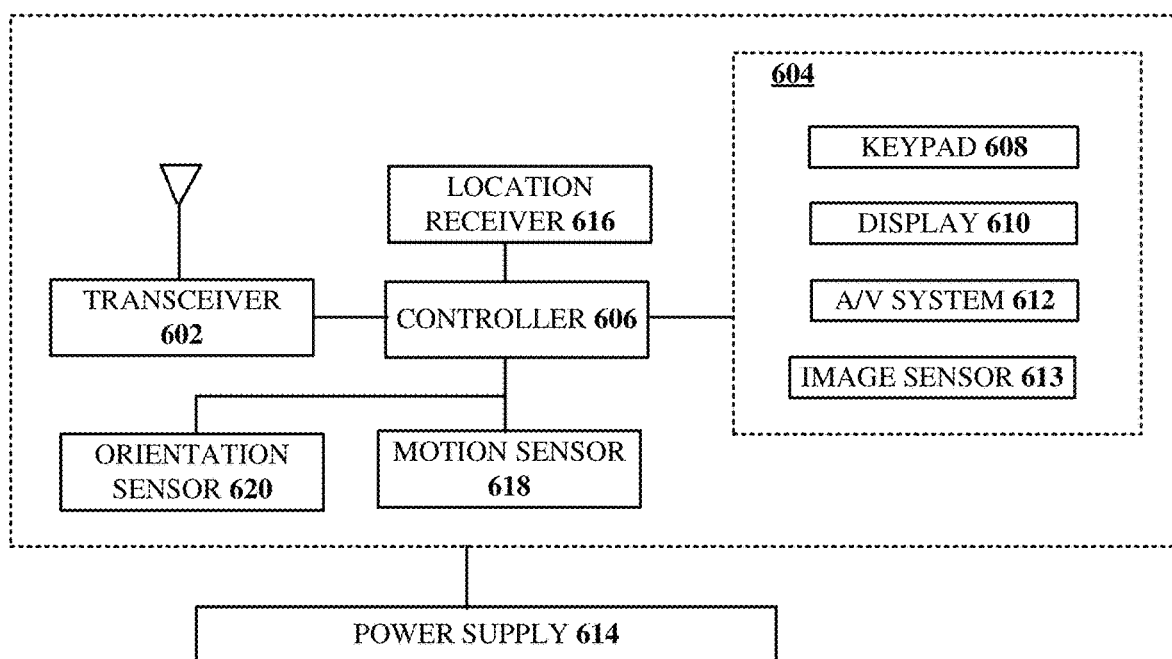
FIG. 6 is a block diagram of an example, non-limiting embodiment of a communication device in accordance with various aspects described herein.

Turning now to FIG. 6, an illustrative embodiment of a communication device 600 is shown. The communication device 600 can serve as an illustrative embodiment of devices such as data terminals 114, mobile devices 124, vehicle 126, display devices 144 or other client devices for communication via either communications network 125. For example, computing device 600 can facilitate in whole or in part splitting, by one or more first hybrid couplers, an RF signal obtained from a transmitter or an antenna into a group of RF signals; filtering, by a plurality of SAW filters, the group of RF signals resulting in a group of filtered RF signals; combining, by one or more second hybrid couplers, the group of filtered RF signals into a filtered RF signal; providing the filtered RF signal to an antenna or a receiver; and managing power amplification utilizing cellular power amplifiers connected to the SAW filters, which can be controlled via MIPI-based techniques such as via commands from a modem.

The communication device 600 can comprise a wireline and/or wireless transceiver 602 (herein transceiver 602), a user interface (UI) 604, a power supply 614, a location receiver 616, a motion sensor 618, an orientation sensor 620, and a controller 606 for managing operations thereof. The transceiver 602 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 602 can also be adapted to support circuit-switched wireline access technologies (such as PSTN), packet-switched wireline access technologies (such as TCP/IP, VoIP, etc.), and combinations thereof.

The UI 604 can include a depressible or touch-sensitive keypad 608 with a navigation mechanism such as a roller ball, a joystick, a mouse, or a navigation disk for manipulating operations of the communication device 600. The keypad 608 can be an integral part of a housing assembly of the communication device 600 or an independent device operably coupled thereto by a tethered wireline interface (such as a USB cable) or a wireless interface supporting for example Bluetooth®. The keypad 608 can represent a numeric keypad commonly used by phones, and/or a QWERTY keypad with alphanumeric keys. The UI 604 can further include a display 610 such as monochrome or color LCD (Liquid Crystal Display), OLED (Organic Light Emitting Diode) or other suitable display technology for conveying images to an end user of the communication device 600. In an embodiment where the display 610 is touch-sensitive, a portion or all of the keypad 608 can be presented by way of the display 610 with navigation features.

The display 610 can use touch screen technology to also serve as a user interface for detecting user input. As a touch screen display, the communication device 600 can be adapted to present a user interface having graphical user interface (GUI) elements that can be selected by a user with a touch of a finger. The display 610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 610 can be an integral part of the housing assembly of the communication device 600 or an independent device communicatively coupled thereto by a tethered wireline interface (such as a cable) or a wireless interface.

The UI 604 can also include an audio system 612 that utilizes audio technology for conveying low volume audio (such as audio heard in proximity of a human ear) and high volume audio (such as speakerphone for hands free operation). The audio system 612 can further include a microphone for receiving audible signals of an end user. The audio system 612 can also be used for voice recognition applications. The UI 604 can further include an image sensor 613 such as a charged coupled device (CCD) camera for capturing still or moving images.

The power supply 614 can utilize common power management technologies such as replaceable and rechargeable batteries, supply regulation technologies, and/or charging system technologies for supplying energy to the components of the communication device 600 to facilitate long-range or short-range portable communications. Alternatively, or in combination, the charging system can utilize external power sources such as DC power supplied over a physical interface such as a USB port or other suitable tethering technologies.

The location receiver 616 can utilize location technology such as a global positioning system (GPS) receiver capable of assisted GPS for identifying a location of the communication device 600 based on signals generated by a constellation of GPS satellites, which can be used for facilitating location services such as navigation. The motion sensor 618 can utilize motion sensing technology such as an accelerometer, a gyroscope, or other suitable motion sensing technology to detect motion of the communication device 600 in three-dimensional space. The orientation sensor 620 can utilize orientation sensing technology such as a magnetometer to detect the orientation of the communication device 600 (north, south, west, and east, as well as combined orientations in degrees, minutes, or other suitable orientation metrics).

The communication device 600 can use the transceiver 602 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 606 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 600.

Other components not shown in FIG. 6 can be used in one or more embodiments of the subject disclosure. For instance, the communication device 600 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

Some of the embodiments described herein can also employ artificial intelligence (AI) to facilitate automating one or more features described herein. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of each cell site of the acquired network. A classifier is a function that maps an input attribute vector, $x=(x1, x2, x3, x4, \ldots, xn)$, to a confidence that the input belongs to a class, that is, $f(x)$ =confidence (class). Such classification can employ a probabilistic and/or statistical-based analysis (e.g., factoring into the analysis utilities and costs) to determine or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A communication device, comprising:
an antenna;
a transmitter;
a receiver; and
a filtering system comprising a plurality of Surface Acoustic Wave (SAW) filters connected with a plurality of hybrid couplers,
wherein an RF signal is received at the antenna, wherein the RF signal is provided to the receiver via the filtering system,
wherein one or more first hybrid couplers of the plurality of hybrid couplers splits the RF signal from the antenna into a group of RF signals and provides the group of RF signals to the plurality of SAW filters,
wherein the plurality of SAW filters performs filtering of the group of RF signals resulting in a group of filtered RF signals and provides the group of filtered RF signals to one or more second hybrid couplers of the plurality of hybrid couplers,
wherein the one or more second hybrid couplers combines the group of filtered RF signals into a filtered RF signal and provides the filtered RF signal to the receiver,
wherein the plurality of hybrid couplers further comprises one or more third hybrid couplers,
wherein the transmitter provides a second RF signal to the one or more third hybrid couplers,
wherein the one or more third hybrid couplers splits the second RF signal into a group of second RF signals and provides the group of second RF signals to the plurality of SAW filters,
wherein the plurality of SAW filters performs filtering of the group of second RF signals resulting in a group of filtered second RF signals and provides the group of filtered second RF signals to the one or more first hybrid couplers,
wherein the one or more first hybrid couplers combines the group of filtered second RF signals into a filtered second RF signal and provides the filtered second RF signal to the antenna.

2. The communication device of claim 1, wherein the antenna and the receiver are configured for an operational power range that includes above 23 dBm.

3. The communication device of claim 2, wherein the one or more first hybrid couplers is a single 90 degree hybrid coupler, wherein the one or more second hybrid couplers is a single 90 degree hybrid coupler, and wherein the plurality of SAW filters is two SAW duplex filters.

4. The communication device of claim 2, wherein the one or more first hybrid couplers are three 90 degree hybrid couplers with one of the three 90 degree hybrid couplers feeding two of the three 90 degree hybrid couplers, wherein the one or more second hybrid couplers are three 90 degree hybrid coupler with two of the three 90 degree hybrid couplers feeding one of the three 90 degree hybrid couplers, and wherein the plurality of SAW filters is four SAW duplex filters.

5. The communication device of claim 1, further comprising:
a feedback circuit;
wherein the feedback circuit provides control signals to adjusts operations of the plurality of hybrid couplers and the plurality of SAW filters to facilitate signal processing performance.

6. The communication device of claim 1, further comprising:
a second SAW filter connected between the receiver and the one or more second hybrid couplers.

7. The communication device of claim 1, wherein the one or more third hybrid couplers is a single 90 degree hybrid coupler, wherein the one or more first hybrid couplers is a single 90 degree hybrid coupler, and wherein the plurality of SAW filters is two SAW duplex filters.

8. The communication device of claim 1, wherein the one or more third hybrid couplers are three 90 degree hybrid couplers with one of the three 90 degree hybrid couplers feeding two of the three 90 degree hybrid couplers, wherein the one or more first hybrid couplers are three 90 degree hybrid coupler with two of the three 90 degree hybrid couplers feeding one of the three 90 degree hybrid couplers, and wherein the plurality of SAW filters is four SAW duplex filters.

9. The communication device of claim 1, further comprising:
a modem; and
a plurality of power amplifiers that are each connected to a corresponding one of the plurality of SAW filters, wherein control signals are provided by the modem to switch mode power supplies connected to the plurality of power amplifiers.

10. The communication device of claim 9, wherein the plurality of power amplifiers are cellular power amplifiers having an output power of at or less than 28 dBm.

11. A device, comprising:
a plurality of acoustic wave filters; and
a plurality of power circuits connected with the acoustic wave filters, wherein the plurality of power circuits includes one or more first and second RF splitters and one or more first and second RF combiners, wherein the second RF combiners are one or more hybrid couplers,
wherein the device is configured for:
connection with an antenna and a transmitter,
connection with a receiver,
splitting, by the one or more RF splitters, an RF signal obtained from the transmitter into a group of RF signals, providing, by the one or more RF splitters, the group of RF signals to the plurality of acoustic wave filters, filtering, by the plurality of acoustic wave filters, the group of RF signals resulting in a group of filtered RF signals, providing, by the plurality of acoustic wave filters, the group of filtered RF signals to the one or more RF combiners, combining, by the one or more RF combiners, the group of filtered RF signals into a filtered RF signal, and providing, by the one or more RF combiners, the filtered RF signal to the antenna splitting, by the one or more hybrid couplers, a second RF signal obtained from the antenna into a group of second RF signals, providing, by the one or more hybrid couplers, the group of second RF signals to the plurality of acoustic wave filters, filtering, by the plurality of acoustic wave filters, the group of second RF signals resulting in a group of filtered second RF signals, providing, by the plurality of acoustic wave filters, the group of second filtered RF signals to the second RF combiners, combining, by the one or more second RF combiners, the group of filtered RF signals into a filtered RF signal, and providing, by the one or more second RF combiners, the filtered RF signal to the receiver.

12. The device of claim 11, wherein the plurality of acoustic wave filters are Surface Acoustic Wave (SAW) filters, and further comprising:

a plurality of power amplifiers that are each connected to a corresponding one of the plurality of SAW filters, wherein the plurality of power amplifiers are configured to connect with, and obtain control signals from, a modem.

13. The device of claim 12, wherein the plurality of power amplifiers are cellular power amplifiers having an output power of at or less than 28 dBm.

14. The device of claim 11, further comprising:

a feedback circuit;

wherein the feedback circuit provides control signals to adjust operations of the one or more hybrid couplers and the plurality of acoustic wave filters to facilitate signal processing performance.

15. The device of claim 11, wherein the one or more RF splitters is a single 90 degree hybrid coupler, wherein the one or more RF combiners is a single 90 degree hybrid coupler, and wherein the plurality of acoustic wave filters is two SAW duplex filters.

16. The device of claim 11, wherein the one or more RF splitters are three 90 degree hybrid couplers with one of the three 90 degree hybrid couplers feeding two of the three 90 degree hybrid couplers, wherein the one or more RF combiners are three 90 degree hybrid coupler with two of the three 90 degree hybrid couplers feeding one of the three 90 degree hybrid couplers, and wherein the plurality of acoustic wave filters is four SAW duplex filters.

17. A method comprising:

splitting, by one or more first hybrid couplers of a device, an RF signal obtained from a transmitter of the device into a group of RF signals;

providing, by the one or more first hybrid couplers, the group of RF signals to a plurality of Surface Acoustic Wave (SAW) filters of the device;

filtering, by the plurality of SAW filters, the group of RF signals resulting in a group of filtered RF signals;

providing, by the plurality of SAW filters, the group of filtered RF signals to one or more second hybrid couplers of the device;

combining, by the one or more second hybrid couplers, the group of filtered RF signals into a filtered RF signal; and providing, by the one or more second hybrid couplers, the filtered RF signal to an antenna of the device splitting, by the one or more second hybrid couplers, a second RF signal obtained from the antenna into a group of second RF signals;

providing, by the one or more second hybrid couplers, the group of second RF signals to the plurality of SAW filters;

filtering, by the plurality of SAW filters, the group of second RF signals resulting in a group of filtered second RF signals;

providing, by the plurality of SAW filters, the group of filtered second RF signals to one or more third hybrid couplers of the device;

combining, by the one or more third hybrid couplers, the group of filtered second RF signals into a filtered second RF signal; and providing, by the one or more third hybrid couplers, the filtered second RF signal to a receiver of the device.

18. The method of claim 17, comprising:

providing, by a feedback circuit, control signals to adjust the one or more first, second, or third hybrid couplers and the plurality of SAW filters to facilitate signal processing performance.

19. The method of claim 17, comprising:

splitting, by the one or more second hybrid couplers, a second RF signal obtained from the antenna into a group of second RF signals;

providing, by the one or more second hybrid couplers, the group of second RF signals to the plurality of SAW filters;

filtering, by the plurality of SAW filters, the group of second RF signals resulting in a group of filtered second RF signals;

providing, by the plurality of SAW filters, the group of second filtered RF signals to the one or more first hybrid couplers of the device;

combining, by the one or more first hybrid couplers, the group of filtered RF signals into a filtered RF signal; and providing, by the one or more first hybrid couplers, the filtered RF signal to a second SAW filter that is connected to a receiver of the device.

20. The method of claim 17, comprising:

receiving control signals at a plurality of power amplifiers of the device from a modem of the device, wherein the providing the group of RF signals by the one or more first hybrid couplers to the plurality of SAW filters is by way of the plurality of power amplifiers that are each connected to a corresponding one of the plurality of SAW filters.

* * * * *